(12) United States Patent
Akiyama

(10) Patent No.: US 7,417,296 B2
(45) Date of Patent: Aug. 26, 2008

(54) DIELECTRIC ISOLATION TYPE SEMICONDUCTOR DEVICE

(75) Inventor: Hajime Akiyama, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 440 days.

(21) Appl. No.: 11/104,478

(22) Filed: Apr. 13, 2005

(65) Prior Publication Data
US 2005/0253170 A1    Nov. 17, 2005

(30) Foreign Application Priority Data
Apr. 21, 2004    (JP) .............................. 2004-125982

(51) Int. Cl.
*H01L 29/00*    (2006.01)
(52) U.S. Cl. .................. 257/500; 257/501; 257/E29.02
(58) Field of Classification Search ................. 257/501, 257/500, 502, 211, 522, 523, 647, 335, 506, 257/E23.013, E29.02, E29.019
See application file for complete search history.

(56) References Cited

U.S. PATENT DOCUMENTS

| 5,485,030 A | | 1/1996 | Terashima |
| 6,025,237 A | * | 2/2000 | Choi .......................... 438/301 |
| 6,049,110 A | | 4/2000 | Koh |

2004/0119132 A1    6/2004    Akiyama et al.

FOREIGN PATENT DOCUMENTS

| DE | 43 26 846 | 4/1994 |
| DE | 692 32 679 | 3/2003 |
| EP | 0 497 577 A2 | 8/1992 |
| JP | 6-216113 | 8/1994 |
| JP | 9-45762 | 2/1997 |
| JP | 3435930 | 8/2003 |

OTHER PUBLICATIONS

Kazuo Imai, "A New Dielectric Isolation Method Using Porous Silicon", Solid State Electronics, 1981, pp. 159-164, vol. 24, Pergamon Press Ltd., Great Britain.
French Office Action dated Feb. 19, 2007.

* cited by examiner

*Primary Examiner*—Howard Weiss
*Assistant Examiner*—Hoa B Trinh
(74) *Attorney, Agent, or Firm*—Buchanan Ingersoll & Rooney PC

(57) ABSTRACT

A dielectric isolation type semiconductor device can achieve high dielectric resistance while preventing the dielectric strength thereof from being limited depending on the thickness of a dielectric layer and the thickness of a first semiconductor layer. A drift $N^-$ region is bonded to a semiconductor substrate through a buried oxide film to from a high withstand-voltage device in the drift $N^-$ region. A first field plate is formed on the drift $N^-$ region in the vicinity of a drain electrode. A first high silicon concentration region composed of a buried $N^+$ region is formed in a porous oxide film region forming a part of the buried oxide film at a location right under the drain electrode. The drain electrode and the first field plate are electrically connected to the first high silicon concentration region through a drain $N^-$ well region.

16 Claims, 11 Drawing Sheets

DIELECTRIC ISOLATION TYPE SEMICONDUCTOR DEVICE

BACKGROUND OF THE INVENTION

1. Field of the Invention

The present invention relates to a dielectric isolation type semiconductor device having a pair of semiconductor substrates bonded to each other through a buried or embedded oxide film.

2. Description of the Related Art

In the past, a variety of dielectric isolation type semiconductor devices have been proposed (for instance, see a first patent document: Japanese patent No. 2739018 (FIGS. 52 through 57)).

As shown in FIGS. 52 and 53 in the first patent document, a semiconductor substrate of a dielectric isolation type semiconductor device is provided on its upper surface and lower surface with a dielectric layer and a rear surface electrode, respectively, with an $N^-$ type semiconductor layer being arranged on an upper surface of the dielectric layer.

In addition, the dielectric layer serves to dielectrically isolate the semiconductor substrate and the $N^-$ type semiconductor layer from each other, and a first insulating film defines the $N^-$ type semiconductor layer in a predetermined range.

An $N^+$ type semiconductor area of a relatively low electric resistance value is formed on the upper surface of the $N^-$ type semiconductor layer in the predetermined range defined by the first insulating film, and a $P^+$ type semiconductor area is also formed so as to surround the $N^+$ type semiconductor area. Moreover, a cathode electrode and an anode electrode are connected with the $N^+$ type semiconductor area and the $P^+$ type semiconductor area, respectively, and the cathode electrode and the anode electrode are electrically insulated from each other by a second insulating film.

Also, as shown in FIG. 54 in the first patent document, if both the anode electrode and the rear surface electrode are set to 0V with a positive voltage applied to the cathode electrode being gradually increased there will develop a first depletion layer that extends from a pn junction between the $N^-$ type semiconductor layer and the $P^+$ type semiconductor area. At this time, since the voltage of the semiconductor substrate is fixed to ground potential and acts as a field plate through the dielectric layer, a second depletion layer in addition to the first depletion layer develops so as to extend from an interface between the $N^-$ type semiconductor layer and the dielectric layer in a direction toward the upper surface of the $N^-$ type semiconductor layer.

In this manner, the first depletion layer becomes able to easily extend toward the cathode electrode owing to the extension of the second depletion layer, whereby an electric field at the pn junction between the $N^-$ type semiconductor layer and the $P^+$ type semiconductor area is alleviated. This effect is generally known as a RESURF (Reduced SURface Field) effect.

Further, as shown in FIG. 55 in the first patent document, let us assume that in the distribution of electric field strength in a cross section at a location sufficiently apart from the $P^+$ type semiconductor area, the vertical width of the second depletion layer is represented by x; the thickness of the dielectric layer is represented by $t_0$; and the upper surface of the $N^-$ type semiconductor layer is made to correspond to the origin of the axis of abscissa. In this case, a full voltage drop V in the above cross section is represented by the following expression (1).

$$V = q \cdot N/(\in_2 \cdot \in_0) \times (x^2/2 + \in_2 \cdot t_0 \cdot x/\in_3) \quad (1)$$

Here, note that in expression (1) above, N is an impurity concentration [$cm^{-3}$] of the $N^+$ type semiconductor layer; $\in_0$ is a dielectric constant [$C \cdot V^{-1} \cdot cm^{-1}$]; $\in_2$ is the dielectric constant of the $N^-$ type semiconductor layer; and $\in_3$ is the dielectric constant of the dielectric layer.

From expression (1) above, it is found that when the thickness to of the dielectric layer is increased while keeping the amount of full voltage drop V unchanged, the vertical width x of the second depletion layer is decreased. This means the RESURF effect becomes weaker.

On the other hand, under the condition that avalanche breakdown due to the concentration of electric field at the pn junction between the $N^-$ type semiconductor layer and the $P^+$ type semiconductor area and the concentration of electric field at the interface between the $N^-$ type semiconductor layer and the $N^+$ type semiconductor area does not occur, the dielectric strength of the semiconductor device is eventually determined by avalanche breakdown due to the concentration of the electric field at the interface between the $N^-$ type semiconductor layer and the dielectric layer at a location right under the $N^+$ type semiconductor area.

In order to construct the semiconductor device so as to satisfy such a condition, the distance between the $P^+$ type semiconductor area and the $N^+$ type semiconductor area has only to be set very long so that the thickness d and the impurity concentration of the $N^-$ type semiconductor layer can be optimized.

For the above condition, it is generally known that when depletion takes place from the interface between the $N^-$ type semiconductor layer and the dielectric layer to a front surface of the $N^-$ type semiconductor layer, the concentration of the electric field at the interface between the $N^-$ type semiconductor layer and the dielectric layer just satisfies the avalanche breakdown condition, as shown in FIG. 56 in the first patent document. In this case, the depletion layer reaches the $N^+$ type semiconductor area, and depletes the entire $N^-$ type semiconductor layer.

A dielectric strength V under such a condition is represented by the following expression (2).

$$V = Ecr \cdot (d/2 + \in_2 \cdot t_0/\in_3) \quad (2)$$

Here, note that in expression (2) above, Ecr is a critical electric field strength that causes avalanche breakdown, and the thickness of the $N^+$ type semiconductor area is ignored.

As shown in FIG. 57 in the above-mentioned first patent document, an electric field strength at a boundary between the $N^-$ type semiconductor layer and the dielectric layer (i.e., a position at a distance d from the origin to the electrode side) in the vertical distribution of electric field strength in a cross section right under the $N^+$ type semiconductor area reaches the critical electric field strength Ecr.

In case where the dielectric strength V of the semiconductor device is calculated with the $N^-$ type semiconductor layer being formed of silicon, and the dielectric layer being formed of a silicon oxide film, $d = 4 \times 10^{-4}$ and $t_0 = 2 \times 10^{-4}$ are adopted as general values for the distance d and the thickness $t_0$, respectively.

Moreover, in this case, the critical electric field strength Ecr, though influenced by the thickness d of the $N^-$ type semiconductor layer, is represented by about $Ecr = 4 \times 10^5$. When this critical electric field strength $Ecr(=4 \times 10^5)$, $\in_2(=11.7)$ and $\in_3(=3.9)$ are substituted in the above expression (2), the dielectric strength V is represented by the following expression (3).

$$V = 320 \, V \quad (3)$$

Accordingly, when the thickness d of the N⁻ type semiconductor layer increases by 1 µm, a voltage rise or increase $\Delta V$ represented by the following expression (4) is obtained.

$$\Delta V = Ecr \times 0.5 \times 10^{-4} = 20 \ [V] \quad (4)$$

In addition, when the thickness $t_0$ of the dielectric layer increases by 1 µm, the voltage rise or increase $\Delta V$ represented by the following expression (5) is obtained.

$$\Delta V = Ecr \times 11.7 \times 10^{-4}/3.9 = 120 \ [V] \quad (5)$$

As will be clear from the results of the calculations of the above expressions (4), (5), a rise or increase in the dielectric strength is greater when the dielectric layer is set thick than when the N⁻ type semiconductor layer is set thick, and hence it can be seen that in order to raise or increase the dielectric strength, it is effective to set the dielectric layer thick.

In addition to this, setting the N⁻ type semiconductor layer thick makes it necessary to employ a technique of etching deeper trenches so as to form the first insulating film, which requires development of a new technology and hence is not desirable.

On the other hand, when the thickness to of the dielectric layer is increased, the extension x of the second depletion layer becomes small, as stated above, thus resulting in reduction in the RESURF effect. That is, the concentration of the electric field at the pn junction between the P⁺ type semiconductor area and the N⁻ type semiconductor layer increases, whereby the dielectric strength will be limited by the accordingly increased probability of avalanche breakdown at this pn junction.

Thus, as stated above, the known dielectric isolation type semiconductor device has a problem in that the dielectric strength of the semiconductor device is limited depending upon the thickness $t_0$ of the dielectric layer and the thickness d of the N⁻ type semiconductor layer.

SUMMARY OF THE INVENTION

Accordingly, the present invention is intended to solve the problem as referred to above, and has for its object to obtain a dielectric isolation type semiconductor device in which high dielectric resistance can be achieved while preventing the dielectric strength of the semiconductor device from being limited depending upon the thickness of a dielectric layer and the thickness of a first semiconductor layer.

Bearing the above object in mind, the present invention resides in a dielectric isolation type semiconductor device which includes: a semiconductor substrate; a dielectric layer disposed adjacent to an entire area of a principal plane of the semiconductor substrate; a first semiconductor layer of a first conductive type of a low impurity concentration bonded to the semiconductor substrate through the dielectric layer; a trench isolation annularly formed in the first semiconductor layer to separate the first semiconductor layer in a lateral direction thereby to provide an element range; and a high withstand-voltage device having a second semiconductor layer of a first conductive type of a high impurity concentration selectively formed on a surface of a central portion of the element range, and a third semiconductor layer of a second conductive type formed in the element range at a location apart from the second semiconductor layer so as surround the second semiconductor layer. The device further includes; a first electrode disposed on and joined to a surface of the second semiconductor layer; a second electrode disposed on and joined to a surface of the third semiconductor layer; a first field plate disposed on the first semiconductor layer so as to cover the second semiconductor layer; a second field plate disposed on the first semiconductor layer so as to cover the third semiconductor layer and surround the first field plate; and a first high silicon concentration region formed in the dielectric layer at a location right under the first electrode. The first electrode and the first high silicon concentration region are electrically connected to each other.

According to the present invention, the first high silicon concentration region electrically connected with the first electrode is formed in the dielectric layer at a location right under the first electrode, so the electric field potential can be compressed or confined into the dielectric layer under the first high silicon concentration region without entering the range of the second semiconductor layer. Accordingly, a rate-controlling factor that an avalanche electric field strength should not be reached in the second semiconductor layer while satisfying the RESURF requirement when the thickness of the dielectric layer is eliminated, and hence it is possible to carry out high withstand-voltage design with a higher degree of freedom by taking account of the strength of the dielectric layer far greater than the avalanche electric field strength.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Now, preferred embodiments of the present invention will be described in detail while referring to the accompanying drawings.

Embodiment 1

Figure 1:
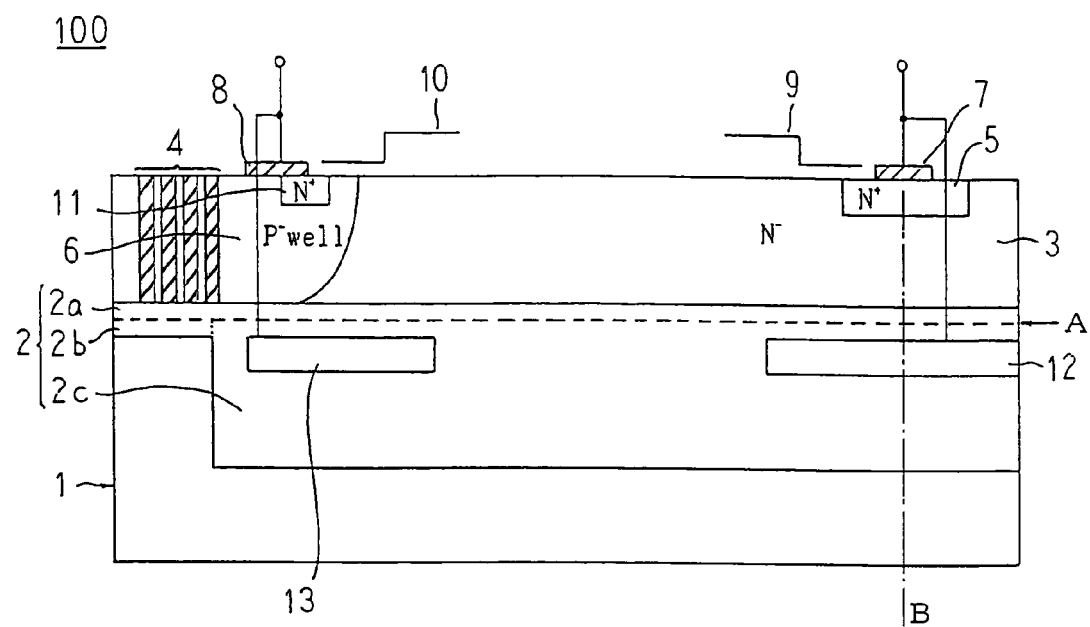
FIG. 1 is a cross sectional view schematically showing the construction of a dielectric isolation type semiconductor device according to a first embodiment of the present invention.

FIG. 1 is a cross sectional view that schematically shows the construction of a dielectric isolation type semiconductor device according to a first embodiment of the present invention.

In FIG. 1, a buried oxide film 2 in the form of a main dielectric layer comprising oxide films 2a, 2b and a porous oxide film region 2c is disposed on an upper surface of a semiconductor substrate 1 formed of a single-crystal silicon, and a drift $N^-$ region 3 (a first semiconductor layer of a first conductive type having a low impurity concentration) is disposed on an upper surface of the buried oxide film layer 2. This buried oxide film layer 2 functions as a dielectric layer that serves to dielectrically separate or isolate the semiconductor substrate 1 and the drift $N^-$ region 3 from each other. In addition, an insulating layer (a trench isolation 4) is circularly or annularly formed so as to extend from a surface of the drift $N^-$ region 3 to the buried oxide film layer 2 through the drift $N^-$ region 3, whereby the drift $N^-$ region 3 is laterally or horizontally separated to define a circular or annular element range.

In the element range thus defined by the trench isolation 4, a drain $N^+$ region 5 (a second semiconductor layer of the first conductive type having a high impurity concentration) of a resistance lower than the drift $N^-$ region 3 is formed on the upper surface of the drift $N^-$ region 3, and a source $P^-$ well region 6 (a third semiconductor layer of a second conductive type) is selectively formed in the drift $N^-$ region 3 so as to surround the drain $N^+$ region 5. A drain electrode 7 in the form of a first electrode and a source electrode 8 in the form of a second electrode are connected with the drain $N^+$ region 5 and the source $P^-$ well region 6, respectively. A first field plate 9 is circularly or annularly formed on the drift $N^-$ region 3 at a location adjacent the drain electrode 7 so as to surround it, and a second field plate 10 is also annularly formed on the drift $N^-$ region 3 at a location adjacent the source electrode 8 on an inner side thereof. A source $N^+$ region 11 is selectively formed on an upper surface of the source $P^-$ well region 6 and is connected with the source electrode 8 together with the source $P^-$ well region 6.

The porous oxide film region 2c is formed in the semiconductor substrate 1 at a location right under the area defined by the trench isolation 4 so as to come in contact with a lower surface of the oxide film 2a. In addition, a first high silicon concentration region 12 comprising a buried $N^+$ region is formed in a disk-like shape in the porous oxide film region 2c at locations right under the drain electrode 7 and the first field plate 9, and a second high silicon concentration region 13 comprising a buried $N^+$ region is circularly or annularly formed in the porous oxide film region 2c at the same depth as that of the first high silicon concentration region 12 at locations right under the source electrode 8 and the second field plate 10 so as to surround the first high silicon concentration region 12. In FIG. 1, a reference character A denotes the bonding surfaces of the oxide films, and a reference character B denotes the center line of the device.

A dielectric isolation type semiconductor device, generally designated at a reference numeral 100 and constructed in this manner, takes an SODI (Silicon On Double Insulator) structure in which a high voltage (i.e., withstand-voltage) device such as an HV-MOS (High-Voltage Metal Oxide Semiconductor) is formed in the drift $N^-$ region 3 on the buried oxide film 2. Also, the drain electrode 7 and the first high silicon concentration region 12 are electrically connected to each other, and the source electrode 8 and the second high silicon concentration region 13 are electrically connected to each other. Here, note that though not illustrated, this high withstand-voltage device has a gate electrode formed on the surface of the source $P^-$ well region 6 through a gate oxide, and functions as a MOSFET.

This dielectric isolation type semiconductor device 100 is prepared, for example, as follows.

First of all, an $N^+$ region is formed on an area on the principal plane surface of a P-type silicon substrate on which the oxide film 2b is provided, and a $P^-$ well region is formed on an area on which the porous oxide film region 2c is provided. At this time, the diffusion depth of the $N^+$ region is made more deep than the depth of the formation of the $P^-$ well region, or the $N^+$ region is covered with a protective film or overcoat such as a nitride film so that it is prevented from being made porous in a porous silicon forming step or process. Also, areas of N-type impurities corresponding to the first and second high silicon concentration regions 12, 13 are formed in the P⁻ well region. Then, the P-type silicon substrate is anodized in an HF solution. In this anodization process, the formation of the P⁻ well region serves to decrease the resistance of an anodization current path, so that a porous silicon area of uniform film quality and thickness can be obtained. In addition, since the areas corresponding to the first and second high silicon concentration regions 12, 13 are formed of the N-type impurities, they depart or deviate from the anodization current path.

Subsequently, the P-type silicon substrate after having been anodized is oxidized to form the porous oxide film region 2c in the porous silicon area. Then, the oxide film 2b is formed on the principal plane of the P-type silicon substrate surrounding the porous oxide film region 2c, whereby the semiconductor substrate 1 is obtained.

Thereafter, the semiconductor substrate 1 and the N-type silicon substrate with the oxide film 2a formed on its principal plane are bonded together with the oxide films 2a, 2b being placed in intimate contact with each other by means of a thermal treatment such as, for example, pyro-oxidation at 1,200° C. for three hours. After this, the N-type silicon substrate is polished to provide the drift N⁻ region 3 of a predetermined thickness necessary for the element range.

Thereafter, trenches are formed in an element isolation area of the drift N⁻ region 3, and an oxide film is then formed on a side surface of the drift N⁻ region 3 thus separated or isolated like an island, after which an insulating film is filled into the isolation trenches to provide the trench isolation 4. Then, the source P⁻ well region 6, the drain N⁺ region 5 and the source N⁺ region 11 are successively formed by diffusion on the drift N⁻ region 3. Finally, the drain electrode 7 and the source electrode 8 are formed, and the first and second field plates 9, 10 are further formed, thus providing the dielectric isolation type semiconductor device 100.

Figure 2:
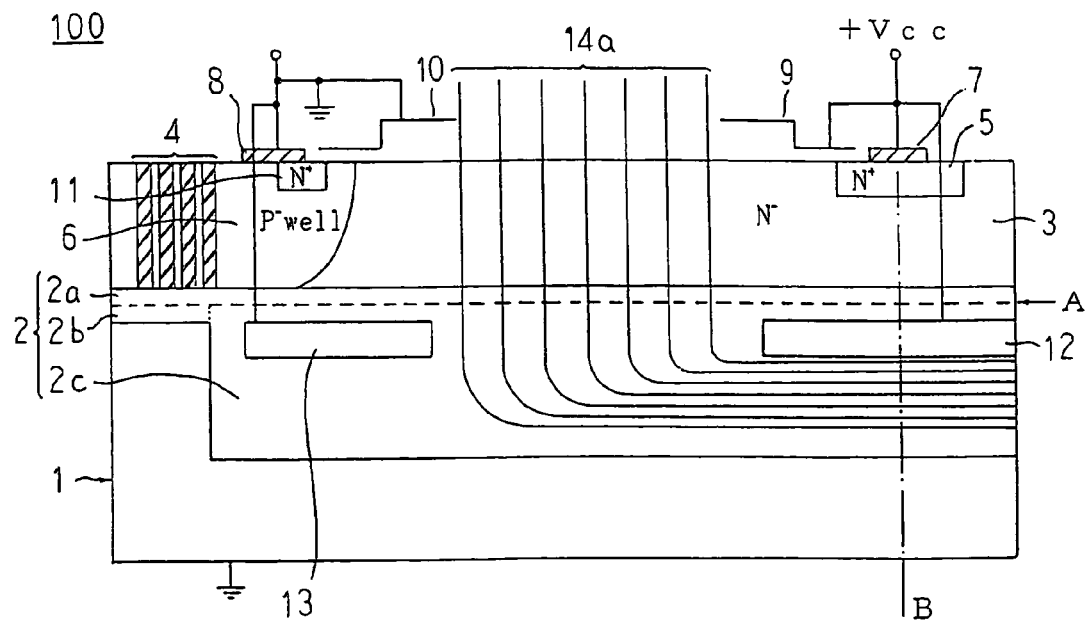
FIG. 2 is a schematic diagram illustrating the operation of the dielectric isolation type semiconductor device according to the first embodiment of the present invention.

FIG. 2 illustrates the state in which a forward stopping or blocking voltage is applied in the dielectric isolation type semiconductor device 100 thus constructed. In FIG. 2, the drain electrode 7, the first field plate 9 and the first high silicon concentration region 12 are set to a forward stopping or blocking potential Vcc, and the semiconductor substrate 1, the source electrode 8, the second field plate 10 and the second high silicon concentration region 13 are set to the earth potential. As a result, an electric field potential 14a is formed between the first and second field plates 9, 10, between the first and second high silicon concentration regions 12, 13, and between the semiconductor substrate 1 and the first high silicon concentration region 12, respectively, as shown in FIG. 2.

Here, in case where the first high silicon concentration region 12 is not formed right under the drain electrode 7, the electric field potential 14a will enter up to the drift N⁻ region 3 located right under the drain N⁺ region 5. Those which act to hold the electric field on a vertical section near the drain electrode 7 are the drift N⁻ region 3 and the buried oxide film layer 2, and the sharing ratio between them is determined by the dielectric constant. As a result, in order to enhance the withstand-voltage or dielectric resistance of the device, it has been necessary to increase the thickness of the buried oxide film 2 while taking into consideration that the RESURF requirement is satisfied and at the same time the avalanche electric field strength is not reached in the drift N⁻ region 3.

In this first embodiment, the first high silicon concentration region 12 is arranged so as to be located right under the drain electrode 7, and the drain electrode 7 and the first high silicon concentration region 12 are electrically connected to each other. Also, the second high silicon concentration region 13 is arranged so as to be located right under the source electrode 8, and the source electrode 8 and the second high silicon concentration region 13 are electrically connected to each other. With such an arrangement, the electric field potential 14a can be compressed or confined within the porous oxide film region 2c between the semiconductor substrate 1 and the first high silicon concentration region 12 without entering the areas of the drift N⁻ region 3 and the buried oxide film layer 2 located right under the drain electrode 7. Accordingly, the above-mentioned rate-controlling factor can be eliminated, thus making it possible to carry out high withstand-voltage design with a higher degree of freedom by taking account of the oxide film strength far greater than the avalanche electric field strength.

In addition, the buried oxide film 2 in the form of the porous oxide film region 2c is composed of a porous silicon oxide film, so the thickness of the film equal to or more than 10 micrometers can be formed relatively easily.

Moreover, the first and second high silicon concentration regions 12, 13 are formed of the buried N⁺ region, and hence the areas corresponding to the first and second high silicon concentration regions 12, 13, being formed of the N-type impurities, depart or deviate from the anodization current path in the porous silicon formation step or process, so the first and second high silicon concentration regions 12, 13 formed of the buried N⁺ regions can be prepared with high precision in a simple and easy manner.

Embodiment 2

Figure 3:
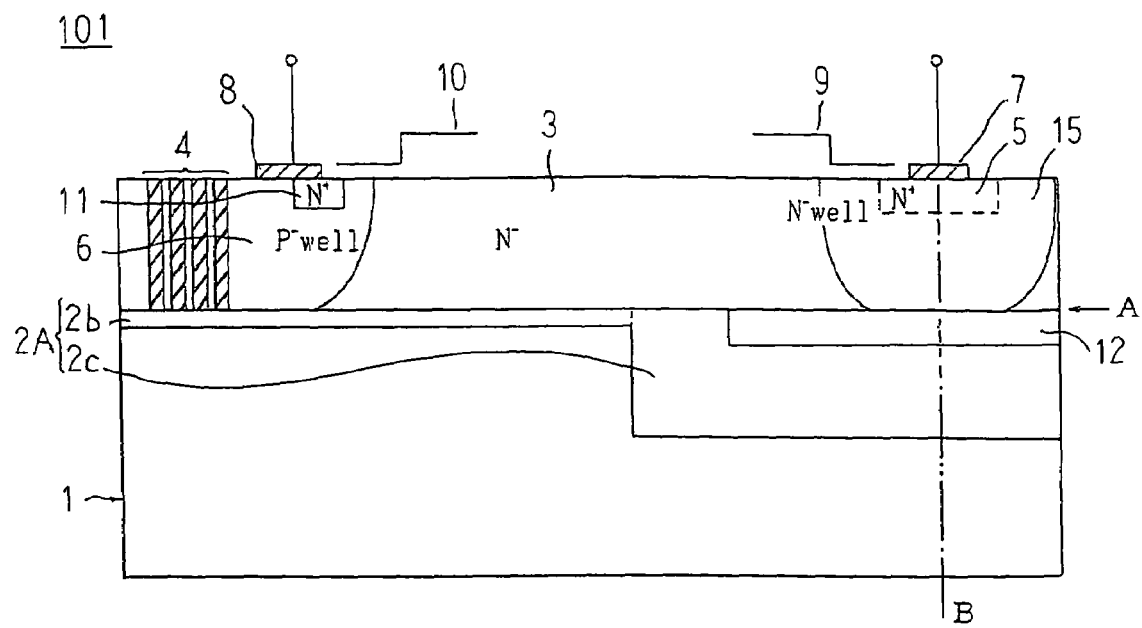
FIG. 3 is a cross sectional view schematically showing the construction of a dielectric isolation type semiconductor device according to a second embodiment of the present invention.

FIG. 3 is a cross sectional view that shows a dielectric isolation type semiconductor device according to a second embodiment of the present invention.

In FIG. 3, a buried oxide film 2A comprising the oxide film 2b and the porous oxide film region 2c is arranged on the upper surface of the semiconductor substrate 1, and the drift N⁻ region 3 is arranged on an upper surface of the buried oxide film layer 2A. In addition, the porous oxide film region 2c is formed so as to cover locations right under the drain electrode 7 and the first field plate 9 while avoiding locations right under the source electrode 8 and the second field plate 10. Also, the first high silicon concentration region 12 is formed in the porous oxide film region 2c at locations right under the drain electrode 7 and the first field plate 9 in a manner as to be exposed on the interface of the bonding surfaces A. Moreover, a drain N⁻ well region 15 is formed in the drift N⁻ region 3 so as to be in direct contact with the first high silicon concentration region 12. With this arrangement, the drain electrode 7 and the first field plate 9 are electrically connected to the first high silicon concentration region 12 through the drain N⁻ well region 15.

Here, note that the construction of this embodiment other than the above is similar to that of the above-mentioned first embodiment.

Figure 4:
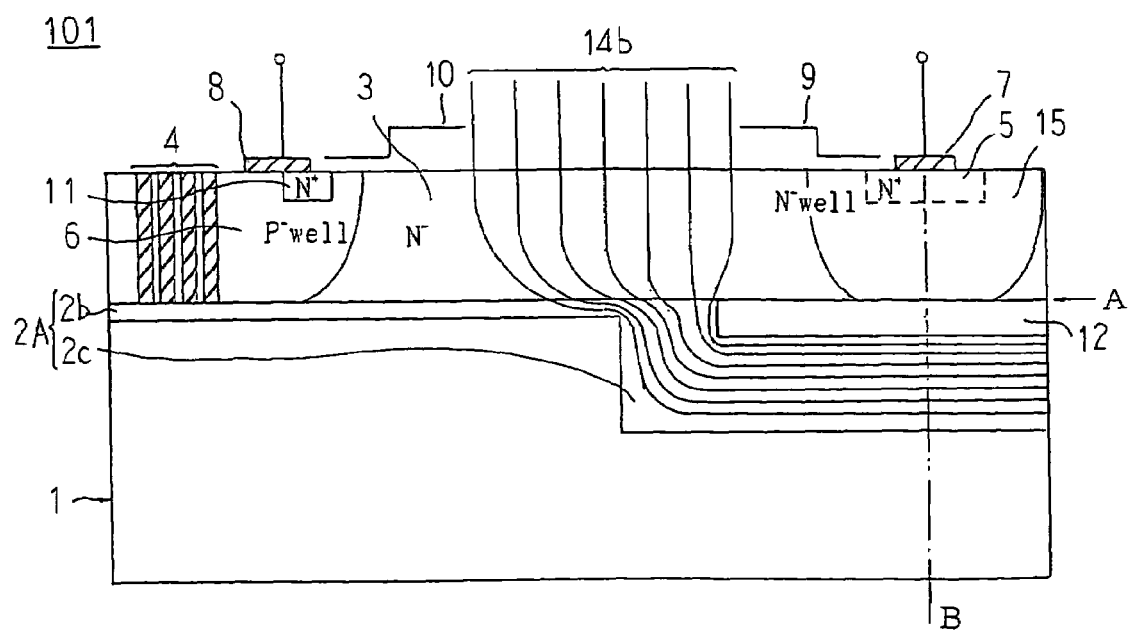
FIG. 4 is a schematic diagram illustrating the operation of the dielectric isolation type semiconductor device according to the second embodiment of the present invention.

FIG. 4 illustrates the state in which a forward stopping or blocking voltage is applied in the dielectric isolation type semiconductor device which is designated at a reference numeral 101 and constructed in this manner. In FIG. 4, the drain electrode 7 and the first field plate 9 are set to the forward stopping or blocking potential Vcc, and the semiconductor substrate 1, the source electrode 8 and the second field plate 10 are set to the earth potential. In this state, the drain N⁻ well region 15 and the first high silicon concentration region 12 are set to the same potential as that of the drain electrode 7. As a result, the electric field potential 14a is formed between the first and second field plates 9, 10, between an outer peripheral surface of the porous oxide film region 2c and the first high silicon concentration region 12, and between the semiconductor substrate 1 and the first high silicon concentration region 12, respectively, as shown in FIG. 4. In other words, the electric field potential 14b is compressed or confined in the porous oxide film region 2c at a location right under the drain electrode 7.

Accordingly, in this second embodiment, too, it is possible to carry out high withstand-voltage design with a higher degree of freedom by taking account of the oxide film strength far greater than the avalanche electric field strength, as in the above-mentioned first embodiment.

In addition, in this second embodiment, since the porous oxide film region 2c is arranged in a required minimum area so as to avoid locations right under the source electrode 8 and the second field plate 10, heat dissipation at the source side can be improved without deteriorating the withstand-voltage or dielectric strength characteristic.

Embodiment 3

Figure 5:
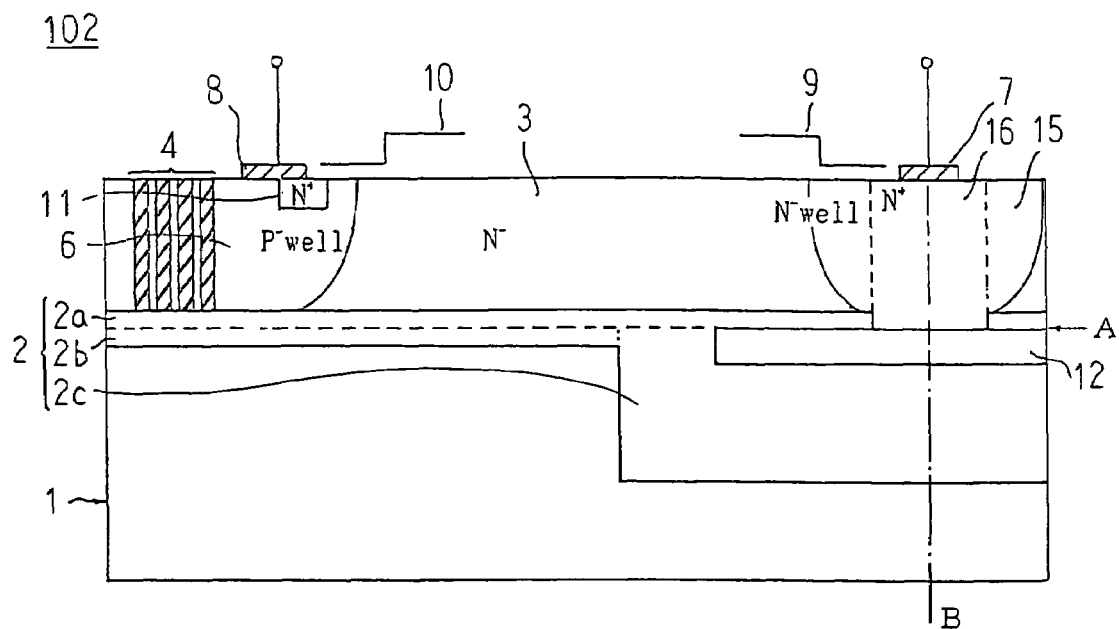
FIG. 5 is a cross sectional view schematically showing the construction of a dielectric isolation type semiconductor device according to a third embodiment of the present invention.

FIG. 5 is a cross sectional view that shows a dielectric isolation type semiconductor device according to a third embodiment of the present invention.

In FIG. 5, the buried oxide film 2 comprising the oxide films 2a, 2b and the porous oxide film region 2c is arranged on the upper surface of the semiconductor substrate 1, and the drift N$^-$ region 3 is arranged on the upper surface of the buried oxide film layer 2. In addition, the porous oxide film region 2c is formed so as to cover locations right under the drain electrode 7 and the first field plate 9 and to be in contact with the oxide film 2a while avoiding locations right under the source electrode 8 and the second field plate 10. Also, the first high silicon concentration region 12 is formed in the porous oxide film region 2c so as to be located right under the drain electrode 7 and the first field plate 9 and to be in contact with the oxide film 2a. Moreover, the drain N$^-$ well region 15 is formed in the drift N$^-$ region 3 so as to be in contact with the upper surface of the oxide film 2a, and a buried drain N$^+$ region 16 (a second semiconductor layer of the first conductive type) is formed in the drain N$^-$ well region 15 so as to be in contact with the first high silicon concentration region 12. With this arrangement, the drain electrode 7 and the first field plate 9 are electrically connected to the first high silicon concentration region 12 through the buried drain N$^+$ region 16.

Here, note that the construction of this embodiment other than the above is similar to that of the above-mentioned first embodiment.

Here, a method of producing the buried drain N$^+$ region 16 will be described.

First of all, similar to the above-mentioned first embodiment, after the N-type silicon substrate and the semiconductor substrate 1 are bonded together and the N-type silicon substrate is polished to a predetermined thickness, the drain N$^-$ well region 15 is formed in the drift N$^-$ region 3. Subsequently, a pattern opening is formed on the upper surface of the drain N$^-$ well region 15 by means of a photoengraving technique, and the drain N$^-$ well region 15 is then etched by means of a silicon anisotropic etching technique to expose the oxide film 2a from the pattern opening. Thereafter, the oxide film 2a is removed to expose the first high silicon concentration region 12 by the use of an oxide film anisotropic etching technique, and in this state, N$^+$ polysilicon is deposited on the first high silicon concentration region 12, and the surface of the deposited N$^+$ polysilicon layer is made flat, thus providing the buried N$^+$ region 16.

In the dielectric isolation type semiconductor device 102 constructed in this manner, when the drain electrode 7 and the first field plate 9 are set to the forward stopping or blocking potential Vcc, the first high silicon concentration region 12 is set to the same potential as that of the drain electrode 7, whereby the electric field potential is compressed or confined in the porous oxide film region 2c at a location right under the drain electrode 7.

Accordingly, in this third embodiment, too, it is possible to carry out high withstand-voltage design with a higher degree of freedom by taking account of the oxide film strength far greater than the avalanche electric field strength, as in the above-mentioned first embodiment.

In addition, in this third embodiment, the buried drain N$^+$ region 16 is arranged so as to connect between the drain electrode 7 and the first high silicon concentration region 12, so the electrical connection between the drain electrode 7 and the first high silicon concentration region 12 can be made in a reliable manner.

Moreover, since the bonding surfaces A are of the oxide films, the interface state density on the interface surface of the substrate side at a lower portion of the high voltage device is reduced, thus making it possible to suppress high temperature leakage current.

Further, since the porous oxide film region 2c is arranged in a required minimum area so as to avoid locations right under the source electrode 8 and the second field plate 10, it is possible to improve heat dissipation at the source side without deteriorating the withstand-voltage or dielectric strength characteristic.

Embodiment 4

Figure 6:
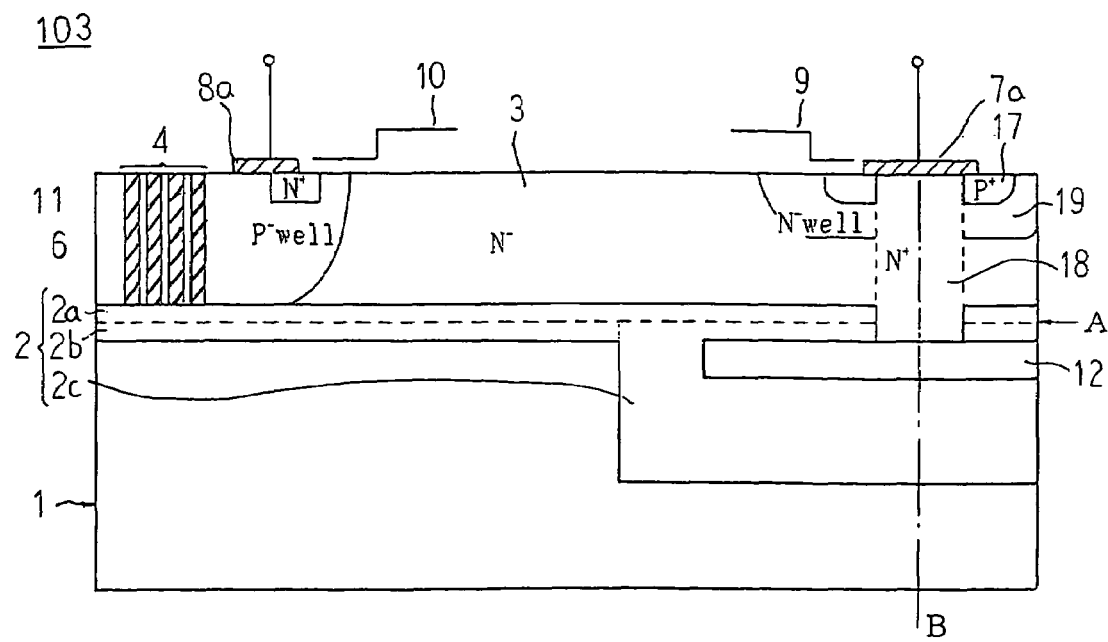
FIG. 6 is a cross sectional view schematically showing the construction of a dielectric isolation type semiconductor device according to a fourth embodiment of the present invention.

FIG. 6 is a cross sectional view that shows a dielectric isolation type semiconductor device according to a fourth embodiment of the present invention.

In the dielectric isolation type semiconductor device, generally designated at a reference numeral 103, according to this fourth embodiment, a high voltage device in the form of an anode short type IGBT (Insulated Gate Bipolar Transistor) is formed in the drift N$^-$ region 3, as shown in FIG. 6, and an anode side structure is constructed as follows. That is, the first field plate 9, an anode P$^+$ region 17 (a drain region of the second conductive type) and a buried anode N$^+$ region 18 (a second semiconductor layer of the first conductive type and a anode short N$^+$ region) are formed so as to be in contact with an anode electrode 7a, and the buried anode N$^+$ region 18 is electrically connected with an anode N$^-$ well region 19 and the first high silicon concentration region 12. Also, the first high silicon concentration region 12 is buried in the porous oxide film region 2c at locations right under the drain electrode 7 and the first field plate 9, and the bonding surfaces A forming an interface are constituted by the oxide film 2a and the porous oxide film region 2c formed on the first high silicon concentration region 12. In addition, a cathode side structure is constructed such that the second field plate 10, the P$^-$ well region 6 (a third semiconductor layer of the second conductive type) and the source N$^+$ region 11 (a source region of first conductive type) are formed so as to be in contact with the cathode electrode 8a.

Here, note that the construction of this embodiment other than the above is similar to that of the above-mentioned first embodiment.

In this fourth embodiment, too, when the anode electrode 7a and the first field plate 9 are set to the forward stopping or blocking potential Vcc, the first high silicon concentration region 12 is set to the same potential as that of the anode electrode 7a, whereby the electric field potential is compressed or confined in the porous oxide film region 2c at a location right under the drain electrode 7.

Accordingly, in this fourth embodiment, too, it is possible to carry out high withstand-voltage design with a higher degree of freedom by taking account of the oxide film strength far greater than the avalanche electric field strength, as in the above-mentioned first embodiment.

Moreover, since in the anode short type IGBT, the expansion of a depletion layer toward the anode N⁻ well region 19 is blocked by the end portions of the first high silicon concentration region 12 and the first field plate 9, high dielectric resistance or high withstand-voltage can be achieved without depleting the anode N⁻ well region 19. That is, it becomes possible to control the injection efficiency of holes as a design parameter independently from the withstand-voltage or dielectric strength.

Further, the bonding surfaces A forming the interface are constituted by the oxide film 2a and the porous oxide film region 2c formed on the first high silicon concentration region 12. Accordingly, the oxide film 2b and the porous oxide film region 2c surrounding the first high silicon concentration region 12 can be formed by oxidizing the entire surface of a wafer (semiconductor substrate 1) in the same step or process, so the flatness of the surface of the semiconductor substrate 1 (i.e., the surfaces of the oxide film 2b and the porous oxide film region 2c) can be improved, thus making it possible to reduce bonding defects and improve the bonding strength as well.

Embodiment 5

Figure 7:
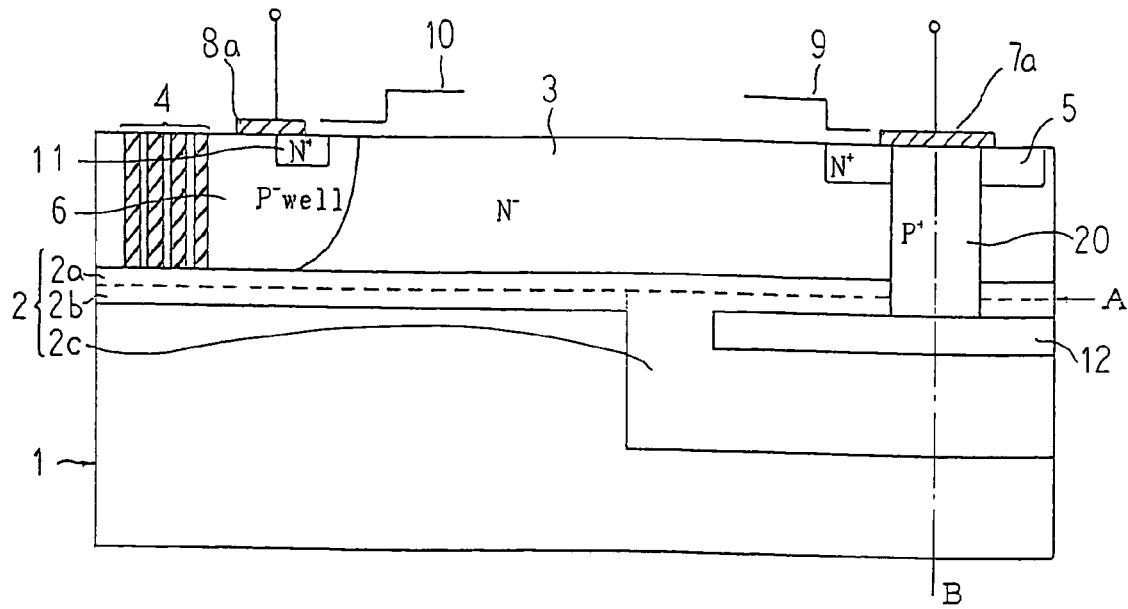
FIG. 7 is a cross sectional view schematically showing the construction of a dielectric isolation type semiconductor device according to a fifth embodiment of the present invention.

FIG. 7 is a cross sectional view that shows a dielectric isolation type semiconductor device according to a fifth embodiment of the present invention.

In the dielectric isolation type semiconductor device, generally designated at a reference numeral 104, according to this fifth embodiment, a high voltage device in the form of a non-punch-through type IGBT is formed in the drift N⁻ region 3, as shown in FIG. 7, and an anode side structure is constructed such that the first field plate 9, the drain N⁺ region 5 (a second semiconductor layer of the first conductive type) and the buried anode P⁺ region 20 (the drain region of the second conductive type) are formed so as to be in contact with the anode electrode 7a, and the buried anode P⁺ region 20 is electrically connected with the first high silicon concentration region 12.

Here, note that the construction of this embodiment other than the above is similar to that of the above-mentioned fourth embodiment.

In this dielectric isolation type semiconductor device 104, too, when the anode electrode 7a and the first field plate 9 are set to the forward stopping or blocking potential Vcc, the first high silicon concentration region 12 is set to the same potential as that of the anode electrode 7a, whereby the electric field potential is compressed or confined in the porous oxide film region 2c at a location right under the drain electrode 7.

Accordingly, in this fifth embodiment, too, it is possible to carry out high withstand-voltage design with a higher degree of freedom by taking account of the oxide film strength far greater than the avalanche electric field strength, as in the above-mentioned fourth embodiment.

Moreover, since in the non-punch-through type IGBT, the expansion of a depletion layer toward the drain N⁺ region 5 is blocked by the end portions of the first high silicon concentration region 12 and the first field plate 9, high dielectric resistance or high withstand-voltage can be achieved while preventing the depletion layer from reaching the drain N⁺ region 5 thereby to cause punch through. That is, in the non-punch-through type IGBT, the rate-controlling factor including the N⁻ concentration and the length of drift necessary to ensure sufficient dielectric strength can be eliminated, thus making it possible to improve the injection efficiency of holes as a completely independent design parameter.

Embodiment 6

Figure 8:
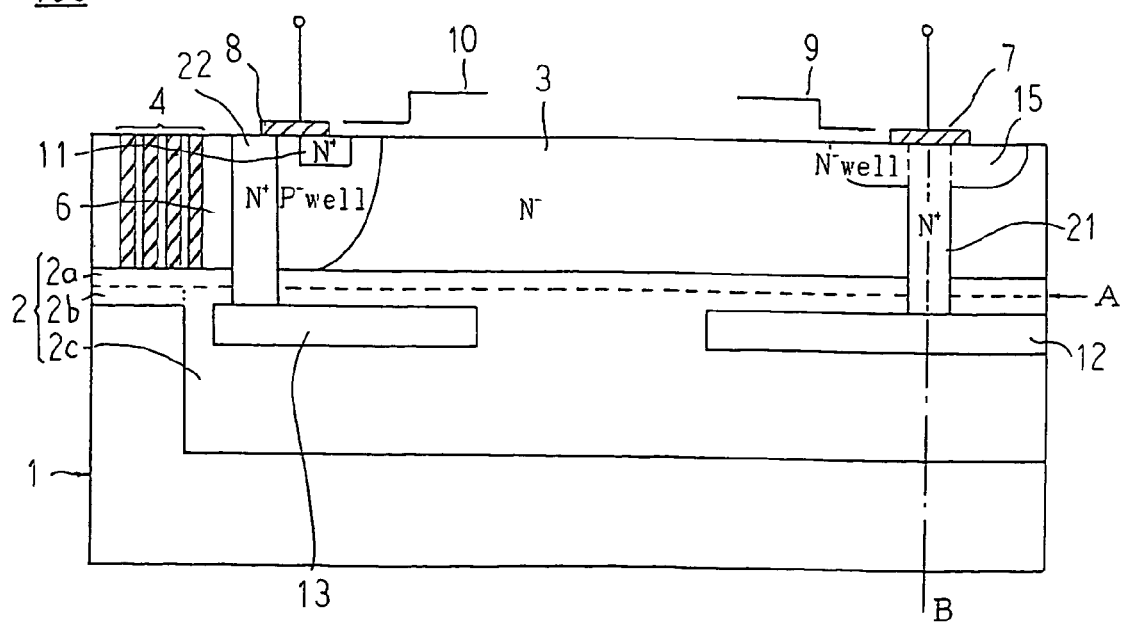
FIG. 8 is a cross sectional view schematically showing the construction of a dielectric isolation type semiconductor device according to a sixth embodiment of the present invention.

FIG. 8 is a cross sectional view that shows a dielectric isolation type semiconductor device according to a sixth embodiment of the present invention.

In the dielectric isolation type semiconductor device, generally designated at a reference numeral 105, according to this sixth embodiment, a high pressure device in the form of a MOS is formed in the drift N⁻ region 3, as shown in FIG. 8, and a drain side structure is constructed as follows. That is, the first field plate 9 is formed so as to be in contact with the drain electrode 7, and a buried drain N⁺ region 21 (a second semiconductor layer of the first conductive type) is formed in the drain N⁻ well region 15 so as to be in contact with the drain electrode 7, and extends through the oxide film 2a and the porous oxide film region 2c so as to be electrically connected with the first high silicon concentration region 12. Also, a source side structure is constructed as follows. That is, the second field plate 10, the source N⁺ region 11 and the source P⁻ well region 6 are formed so as to be in contact with the source electrode 8, and a buried source N⁺ region 22 (a source electrode side connection N⁺ region) is formed in the source P⁻ well region 6 so as to be in contact with the source electrode 8, and extends through the oxide film 2a and the porous oxide film region 2c so as to be electrically connected with the second high silicon concentration region 13.

Here, note that the construction of this embodiment other than the above is similar to that of the above-mentioned first embodiment.

In the dielectric isolation type semiconductor device 105, too, when the drain electrode 7 and the first field plate 9 are set to the forward stopping or blocking potential Vcc, the first high silicon concentration region 12 is set to the same potential as that of the drain electrode 7. When the semiconductor substrate 1, the source electrode 8 and the second field plate 10 are set to the earth potential, the second high silicon concentration region 13 is also set to the same potential as that of the source electrode 8, whereby the electric field potential is compressed or confined in the porous oxide film region 2c at a location right under the drain electrode 7.

Accordingly, in this sixth embodiment, too, it is possible to carry out high withstand-voltage design with a higher degree of freedom by taking account of the oxide film strength far greater than the avalanche electric field strength, as in the above-mentioned first embodiment.

Embodiment 7

Figure 9:
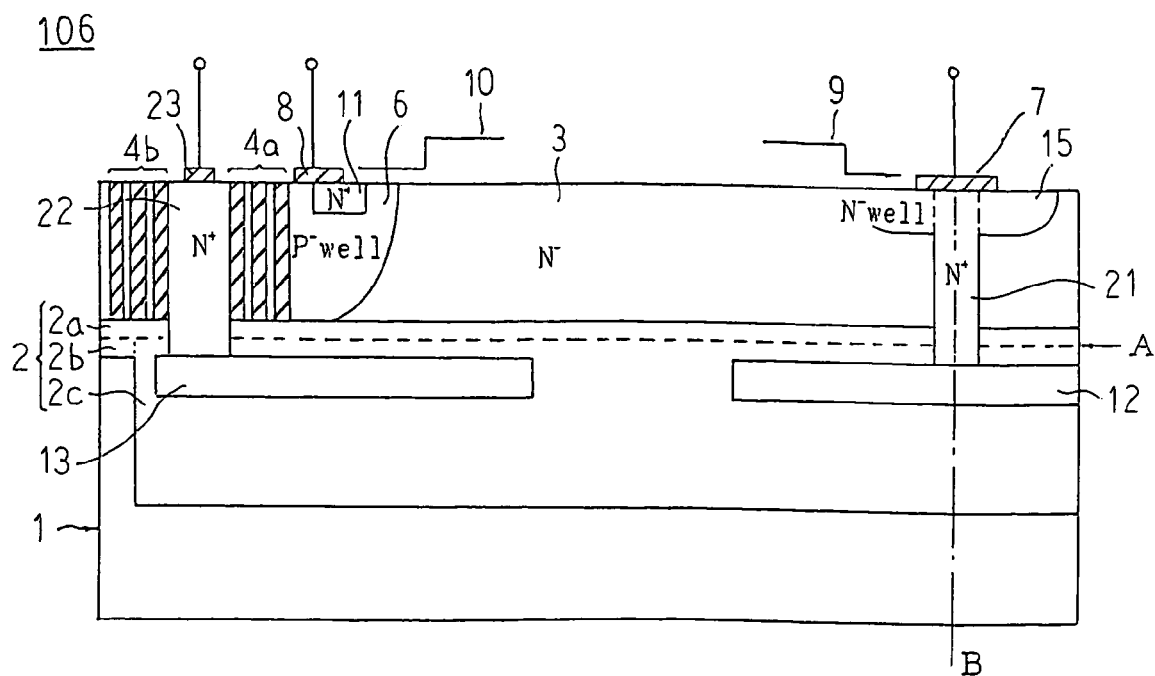
FIG. 9 is a cross sectional view schematically showing the construction of a dielectric isolation type semiconductor device according to a seventh embodiment of the present invention.

FIG. 9 is a cross sectional view that shows a dielectric isolation type semiconductor device according to a seventh embodiment of the present invention.

In FIG. 9, the dielectric isolation type semiconductor device, generally designated at a reference numeral 106, has a high pressure device in the form of a MOS formed in the drift N⁻ region 3. A connection buried source N⁺ region 22, being electrically separated or isolated from the source P⁻ well region 6 by a first trench isolation 4a comprising a plurality of trenches, is formed in the drift N⁻ region 3 and extends through the oxide film 2a and the porous oxide film region 2c so as to be electrically connected with the second high silicon concentration region 13. Also, a source electrode 23 (a third electrode) is formed on the upper surface of the drift N⁻ region 3 so as to be in contact with the buried source N⁺ region 22. In addition, a second trench isolation 4b comprising a plurality of trenches is circularly or annularly formed at an outer peripheral side of the buried source N⁺ region 22 for separation of the entire device.

Here, note that the construction of this embodiment other than the above is similar to that of the above-mentioned sixth embodiment.

In this dielectric isolation type semiconductor device 106, too, when the drain electrode 7 and the first field plate 9 are set to the forward stopping or blocking potential Vcc, the first high silicon concentration region 12 is set to the same potential as that of the drain electrode 7, whereby the electric field potential is compressed or confined in the porous oxide film region 2c at a location right under the drain electrode 7.

Accordingly, in this seventh embodiment, too, it is possible to carry out high withstand-voltage design with a higher degree of freedom by taking account of the oxide film strength far greater than the avalanche electric field strength, as in the above-mentioned sixth embodiment.

In addition, according to this seventh embodiment, the two source electrodes 8, 23 are separated or isolated from each other by the first trench isolation 4a, so it is possible to ensure a high withstand-voltage or dielectric resistance characteristic with the source electrode 8 being connected to a floating power supply and with the source electrode 23 being set to the earth potential. Moreover, the dielectric strength between the source electrodes 8, 23 can be uniquely set by the number of trenches and the thickness of an oxide film formed on each trench sidewall without the need of keeping a subtle balance between the interval and depth of a diffusion island, as is required in conventional dielectric isolation type semiconductor devices.

Embodiment 8

Figure 10:
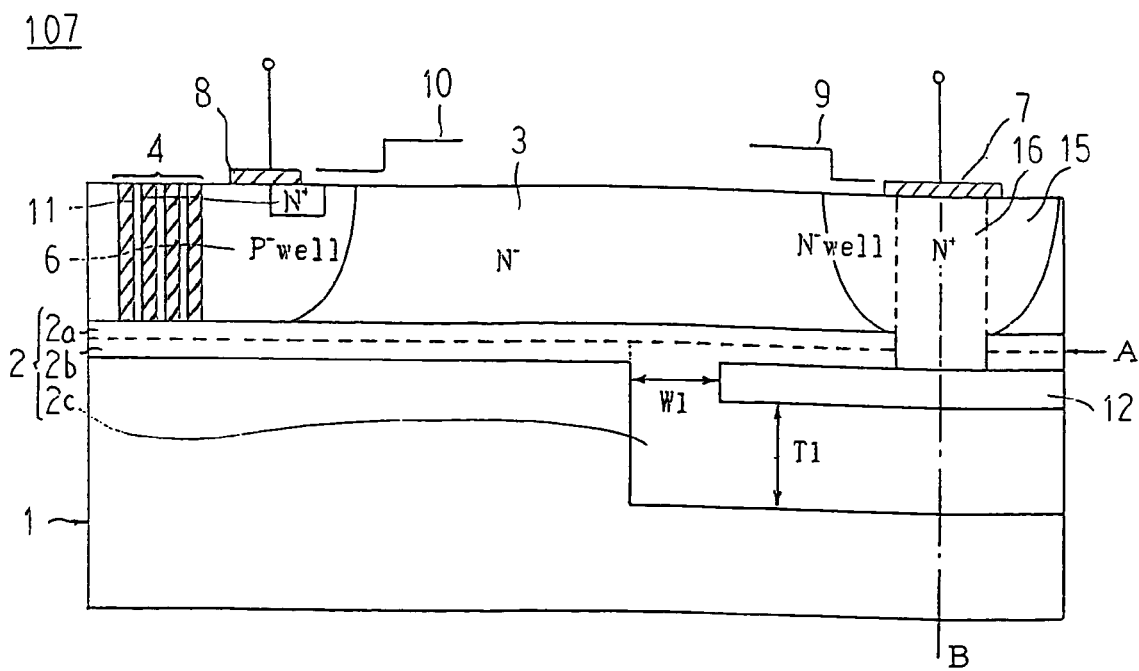
FIG. 10 is a cross sectional view schematically showing the construction of a dielectric isolation type semiconductor device according to an eighth embodiment of the present invention.

FIG. 10 is a cross sectional view that shows a dielectric isolation type semiconductor device according to an eighth embodiment of the present invention.

As shown in FIG. 10, this dielectric isolation type semiconductor device, generally designated at a reference numeral 107, sets the diametral width W1 of the porous oxide film region 2c, which is a path for the electric field potential, at an outer peripheral side of the first high silicon concentration region 12 (i.e., the width of the porous oxide film region 2c in the horizontal direction of the first high silicon concentration region 12) and the depth T1 of the porous oxide film region 2c at a side of the first high silicon concentration region 12 opposite to the drift N⁻ region (i.e., the width or length of the porous oxide film region 2c in the vertical direction of the first high silicon concentration region 12) by taking account of the dielectric breakdown strength of the oxide film. In other words, the width W1 and the depth T1 of the porous oxide film region 2c are set so as to satisfy the following relations:

$$W1(\mu m) > 0.01(\mu m/v) \times BV(v), \text{ and}$$

$$T1(\mu m) > 0.01(\mu m/v) \times BV(v)$$

where BV is the dielectric strength (the unit: v (bolts)) of the high withstand-voltage island required for using the semiconductor device.

Here, note that the construction of this embodiment other than the above is similar to that of the above-mentioned third embodiment.

In this eighth embodiment, there are obtained the following advantageous effects in addition to those of the above-mentioned third embodiment. That is, since the width W1 and the depth T1 of the porous oxide film region 2c are set so as to satisfy the relations $W1(\mu m) > 0.01(\mu m/v) \times BV(v)$ and $T1(\mu m) > 0.01(\mu m/v) \times BV(v)$, the porous oxide film region 2c can have a satisfactory dielectric breakdown strength with a sufficient margin for an electric field strength of 1 MV/cm, though the dielectric breakdown strength of the porous oxide film region 2c slightly changes depending on the properties such as the porosity, the pore size, etc., of the porous silicon that forms the porous oxide film region 2c. Besides, the protrusion of the porous oxide film region 2c toward the source side can be suppressed to a necessary minimum, so a high withstand-voltage or dielectric strength characteristic can be ensured, and the oxide film 2b of a smaller thermal resistance can be arranged over necessary and sufficient space, thus making it possible to improve the heat dissipation on the source side.

Embodiment 9

Figure 11:
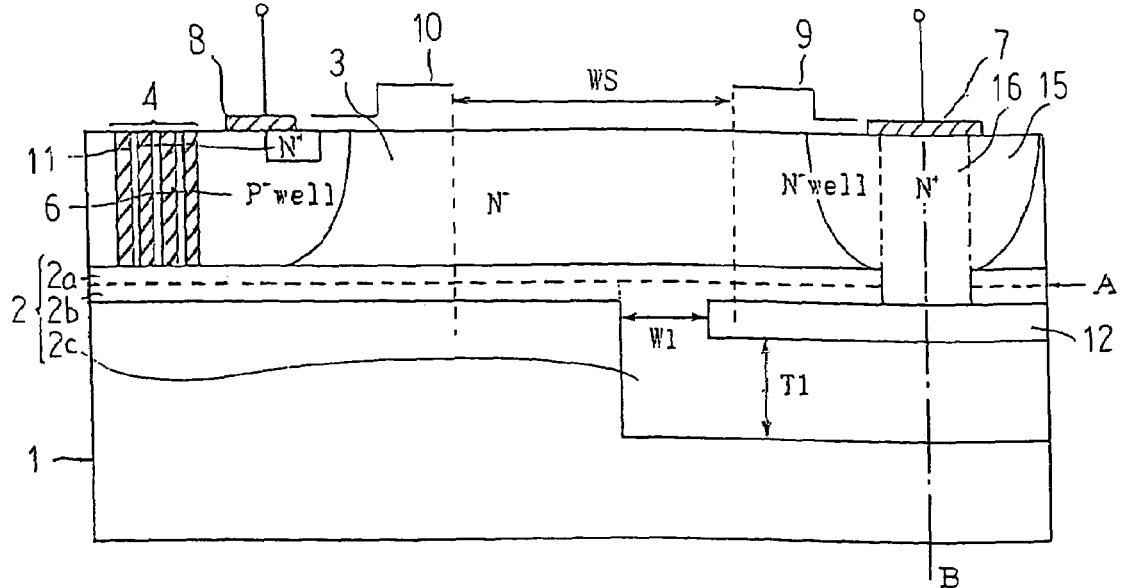
FIG. 11 is a cross sectional view schematically showing the construction of a dielectric isolation type semiconductor device according to a ninth embodiment of the present invention.

FIG. 11 is a cross sectional view that shows a dielectric isolation type semiconductor device according to a ninth embodiment of the present invention.

As shown in FIG. 11, in this dielectric isolation type semiconductor device, generally designated at a reference numeral 108, the width W1 and the depth T1 of the porous oxide film region 2c are set so as to satisfy the relations $W1(\mu m) > 0.01(\mu m/v) \times BV(v)$ and $T1(\mu m) > 0.01(\mu m/v) \times BV(v)$, and an area of the porous oxide film region 2c, which is a path for the electric field potential, lying at the outer peripheral side of the first high silicon concentration region 12, is located or contained within an area WS defined between the first and second field plates 9, 10 with respect to the direction orthogonal to the interface of the bonding surfaces A.

Here, note that the construction of this embodiment other than the above is similar to that of the above-mentioned eighth embodiment.

According to this ninth embodiment, there are obtained the following advantageous effects in addition to those of the above-mentioned eight embodiment. That is, since the area of the porous oxide film region 2c, which is the path for the electric field potential, lying at the outer peripheral side of the first high silicon concentration region 12 is located within the area WS between the first and second field plates 9, 10 with respect to the direction orthogonal to the interface of the bonding surfaces A, the electric field potential crossing the area (i.e., the area W1) of the porous oxide film region 2c at the outer peripheral side of the first high silicon concentration region 12 is held in a shape that extends to both the source side and the drain side. As a result, avalanche breakdown due to the concentration of electric field in the vicinity of the first and second field plates 9, 10 can be suppressed, thus making it possible to keep stable the high withstand-voltage or dielectric resistance characteristic.

Embodiment 10

Figure 12:
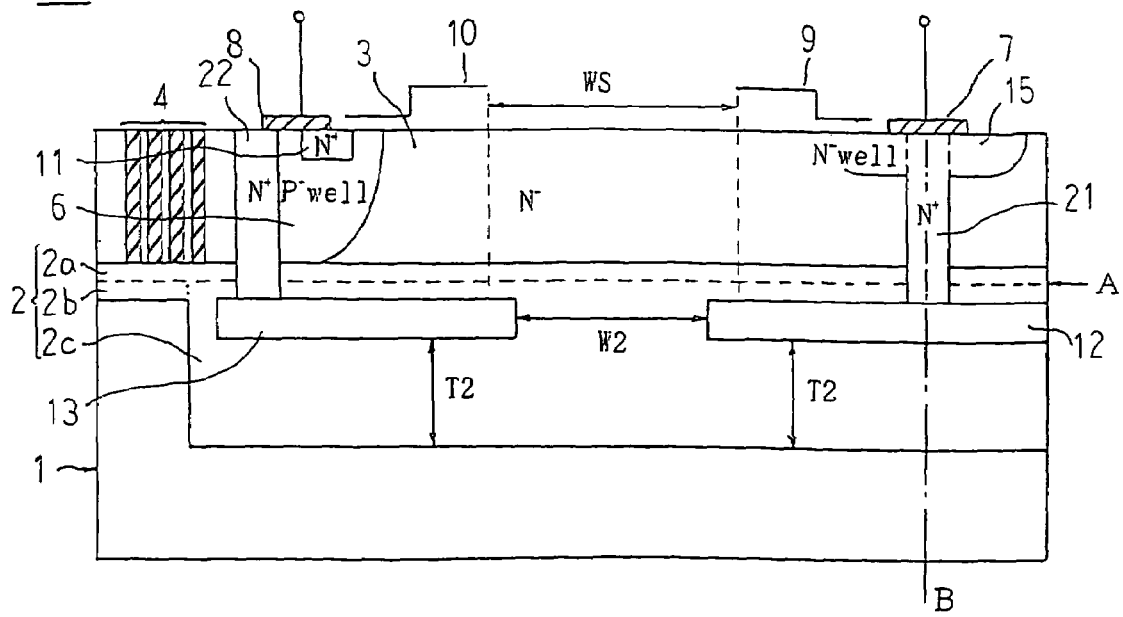
FIG. 12 is a cross sectional view schematically showing the construction of a dielectric isolation type semiconductor device according to a tenth embodiment of the present invention.

FIG. 12 is a cross sectional view that shows a dielectric isolation type semiconductor device according to a tenth embodiment of the present invention.

As shown in FIG. 12, this dielectric isolation type semiconductor device, generally designated at reference numeral 109, sets the diametral width W2 of the porous oxide film region 2c, which is a path of the electric field potential, defined between the first high silicon concentration region 12 and the second high silicon concentration region 13 and the depth T2 of the porous oxide film region 2c at a side of the first and second high silicon concentration regions 12, 13 opposite to the drift N⁻ region (i.e., the width or length of the porous oxide film region 2c in the vertical direction of the first and second high silicon concentration regions 12, 13) by taking account of the dielectric breakdown strength of the oxide film. In other words, the width W2 and the depth T2 of the porous oxide film region 2c are set so as to satisfy the following relations:

$$W2(\mu m) > 0.01(\mu m/v) \times BV(v), \text{ and}$$

$$T2(\mu m) > 0.01(\mu m/v) \times BV(v).$$

In addition, an area of the porous oxide film region 2c, which is a path for the electric field potential, lying between the first and second high silicon concentration regions 12, 13 is located or contained within an area WS defined between the first and second field plates 9, 10 with respect to the direction orthogonal to the interface of the bonding surfaces A.

Here, note that the construction of this embodiment other than the above is similar to that of the above-mentioned sixth embodiment.

According to this tenth embodiment, there are obtained the following advantageous effects in addition to those of the above-mentioned eight embodiment. That is, since the width W2 and the depth T2 of the porous oxide film region 2c is set so as to satisfy the relations W2($\mu$m)>0.01($\mu$m/v)×BV(v) and T2($\mu$m)>0.01($\mu$m/v)×BV(v), the porous oxide film region 2c can have a satisfactory dielectric breakdown strength with a sufficient margin for an electric field strength of 1 MV/cm, though the dielectric breakdown strength of the porous oxide film region 2c slightly changes depending on the properties such as the porosity, the pore size, etc., of the porous silicon that forms the porous oxide film region 2c. More, since the area of the porous oxide film region 2c, which is a path for the electric field potential, lying between the first and second high silicon concentration regions 12, 13 is located or contained within an area WS defined between the first and second field plates 9, 10 with respect to the direction orthogonal to the interface of the bonding surfaces A, the electric field potential crossing the area (i.e., the area W2) of the porous oxide film region 2c is held in a shape that extends to both the source side and the drain side. As a result, avalanche breakdown due to the concentration of electric field in the vicinity of the first and second field plates 9, 10 can be suppressed, thus making it possible to keep stable the high withstand-voltage or dielectric resistance characteristic.

Embodiment 11

Figure 13:
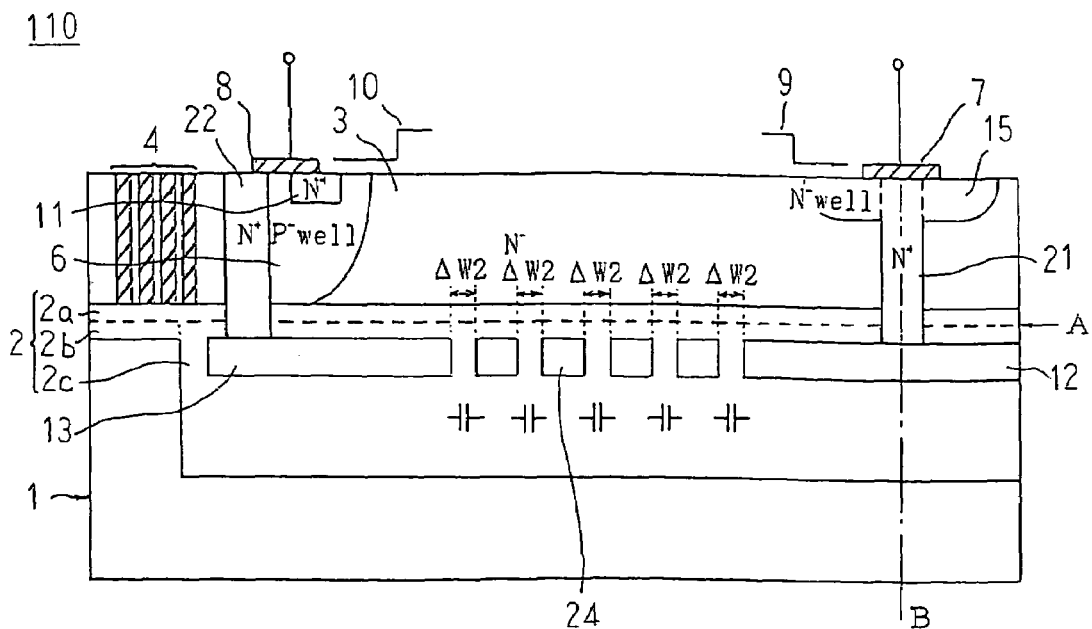
FIG. 13 is a cross sectional view schematically showing the construction of a dielectric isolation type semiconductor device according to an eleventh embodiment of the present invention.

FIG. 13 is a cross sectional view that shows a dielectric isolation type semiconductor device according to an eleventh embodiment of the present invention.

As shown in FIG. 13, this dielectric isolation type semiconductor device, generally designated at a reference numeral 110, has a first MFP (Multi Field Plate) structure in which a plurality of first buried N⁺ regions 24 are circularly or annularly formed apart a distance or gap ΔW2 from one another in an area of the porous oxide film region 2c, which is a path for the electric field potential, between the first high silicon concentration region 12 and the second high silicon concentration region 13. The plurality of first buried N⁺ regions 24 are arranged mutually apart from one another and formed circularly or annularly in a manner such that they are mutually independent from one another in electrically floating states, and formed in a self-ending or self-terminating manner. In addition, there exist capacitive couplings between the first high silicon concentration region 12 and one of the first buried N⁺ regions 24, between the second high silicon concentration region 13 and another one of the first buried N⁺ regions 24, and between adjacent ones of the first buried N⁺ regions 24, respectively, and the total sum Σ W2($\mu$m) of the gaps ΔW2 is formed so as to satisfy the following inequity:

$$\Sigma W2(\mu m) > 0.01(\mu m/v) \times BV(v).$$

Here, note that the construction of this embodiment other than the above is similar to that of the above-mentioned tenth embodiment.

In this dielectric isolation type semiconductor device 110, since the total sum ΣW2 of gaps ΔW2 in the first buried N⁺ regions 24 is set to be greater than 0.01($\mu$m/v)×BV(v) (i.e., ΣW2($\mu$m)>0.01($\mu$m/v)×BV(v)), the porous oxide film region 2c can have a satisfactory dielectric breakdown strength with a sufficient margin for an electric field strength of 1 MV/cm.

Figure 14:
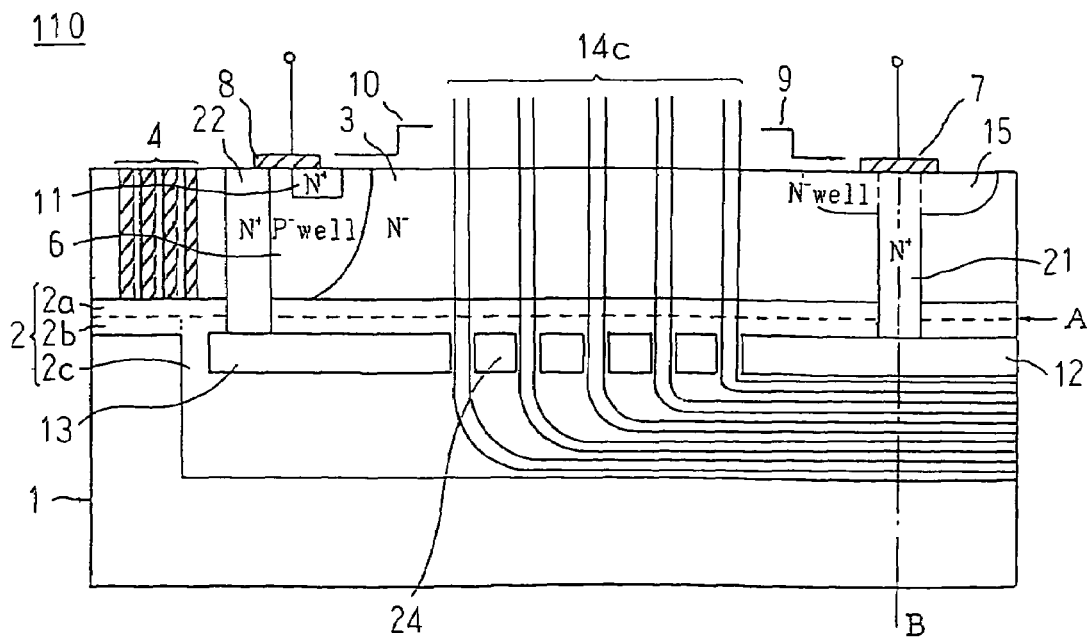
FIG. 14 is a schematic diagram illustrating the operation of the dielectric isolation type semiconductor device according to the eleventh embodiment of the present invention.

Moreover, an electric field potential 14c crossing between the first and second high silicon concentration regions 12, 13 upon application of a forward withstand-voltage is evenly distributed by the capacity dividing function of the first MFP structure of the first buried N⁺ regions 24, as shown in FIG. 14, so that peaks of the electric field strength are leveled.

Thus, according to this eleventh embodiment, a high withstand-voltage or dielectric resistance characteristic can be achieved while keeping safer dielectric strength in comparison with the above-mentioned tenth embodiment.

Embodiment 12

Figure 15:
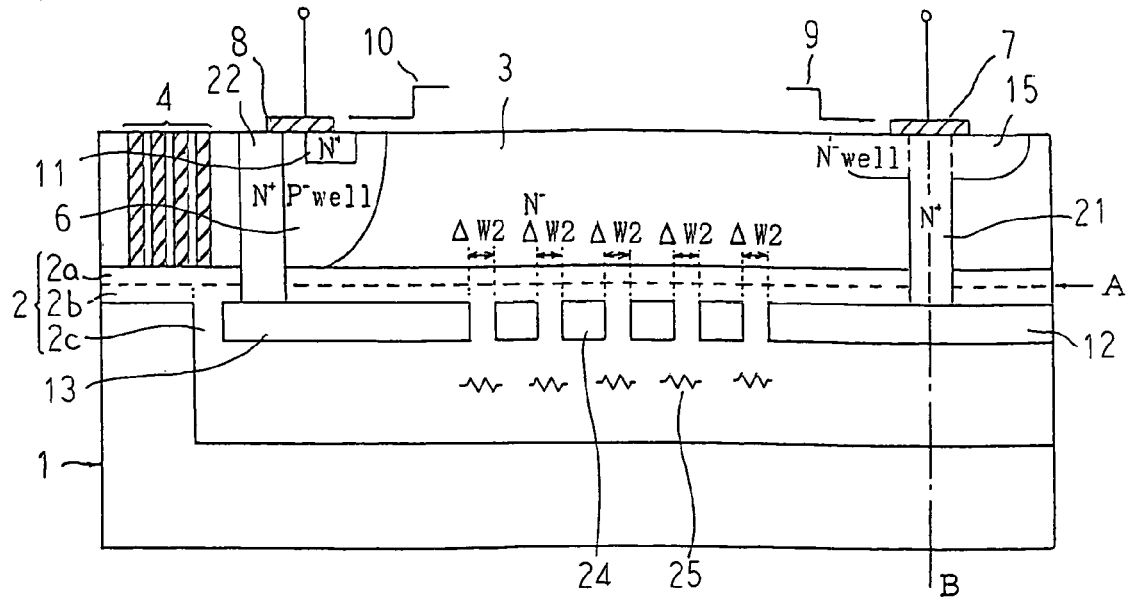
FIG. 15 is a cross sectional view showing a dielectric isolation type semiconductor device according to a twelfth embodiment of the present invention.
Figure 16:
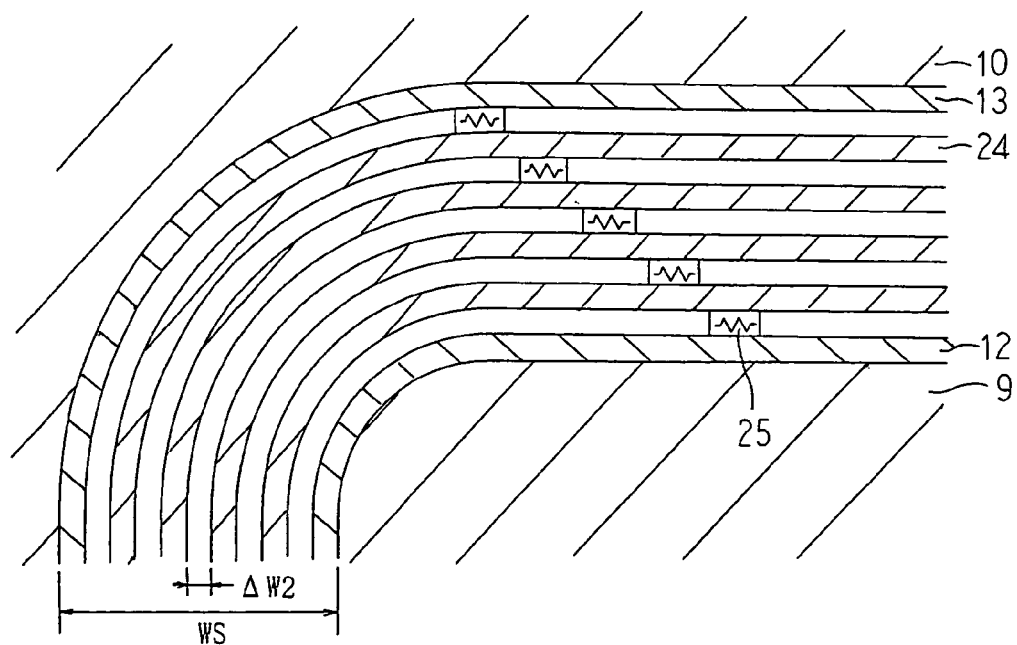
FIG. 16 is a view showing the positional relationship between first and second field plates and a buried $N^+$ region in a dielectric isolation type semiconductor device according to the twelfth embodiment of the present invention, as seen from above in a direction orthogonal to an interface between bonding surfaces A.

FIG. 15 is a cross sectional view that shows a dielectric isolation type semiconductor device according to a twelfth embodiment of the present invention. FIG. 16 is a view that shows the positional relation between the first and second field plates and the buried N⁺ region in a dielectric isolation type semiconductor device according to the twelfth embodiment of the present invention, as seen from above in a direction orthogonal to an interface between the bonding surfaces A.

As shown in FIG. 15 and FIG. 16, in this dielectric isolation type semiconductor device, generally designated at a reference numeral 111, a plurality of electric conductivity imparting parts 25 are formed between the first high silicon concentration region 12 and one of the first buried N⁺ regions 24, between the second high silicon concentration region 13 and another one of the first buried N⁺ regions 24, and between adjacent ones of the first buried N⁺ regions 24. These electric conductivity imparting parts 25 are formed, after formation of the porous oxide film region 2c, by driving Si, P, As or the like into the porous oxide film region 2c thus formed by means of high energy injection or implantation in the same range as the depth of the first buried N⁺ regions 24. As a result, resistance couplings due to the electric conductivity imparting parts 25 are interposed between the first high silicon concentration region 12 and the one of the first buried N⁺ regions 24, between the second high silicon concentration region 13 and the another one of the first buried N⁺ regions 24, and between the adjacent ones of the first buried N⁺ regions 24. Here, it is desirable to arrange the electric conductivity imparting parts 25 in a manner distributed in a circumferential direction so as to prevent the concentration of their arrangement positions.

Here, note that the construction of this embodiment other than the above is similar to that of the above-mentioned eleventh embodiment.

In this dielectric isolation type semiconductor device 111, the electric field potential 14c crossing between the first and second high silicon concentration regions 12, 13 upon application of a forward withstand-voltage is evenly distributed by the first MFP structure of the first buried N+ regions 24 and the resistance dividing function of the electric conductivity imparting parts 25, so that peaks of the electric field strength are leveled.

Accordingly, in this twelfth embodiment, too, a high withstand-voltage or dielectric resistance characteristic can be achieved while keeping safer dielectric strength.

Embodiment 13

Figure 17:
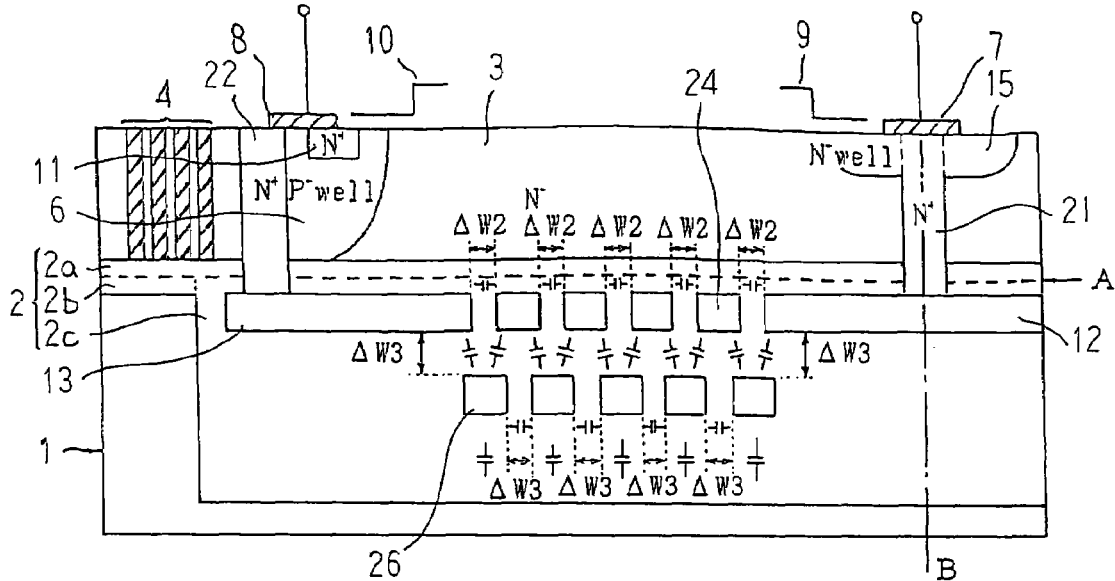
FIG. 17 is a cross sectional view schematically showing the construction of a dielectric isolation type semiconductor device according to a thirteenth embodiment of the present invention.

FIG. 17 is a cross sectional view that shows a dielectric isolation type semiconductor device according to a thirteenth embodiment of the present invention.

As shown in FIG. 17, this dielectric isolation type semiconductor device, generally designated at a reference numeral 112, has a second MFP structure in which a plurality of second buried N+ regions 26 are circularly or annularly formed on a side of the first buried N+ regions 24 opposite to the drain electrode at locations away a vertical distance $\Delta W3$ from the first high silicon concentration region 12, the second high silicon concentration region 13 and the first buried N+ regions 24, and mutually apart a distance $\Delta W3$ from one another. In addition, there exist capacitive couplings between the first high silicon concentration region 12 and one of the second buried N+ regions 26, between the second high silicon concentration region 13 and another one of the second buried N+ regions 26, and between adjacent ones of the second buried N+ regions 26, respectively, and the total sum $\Sigma W3$ ($\mu$m) of the gaps $\Delta W3$ is formed so as to satisfy the following inequity:

$$\Sigma W3(\mu m) > 0.01(\mu m/v) \times BV(v).$$

Here, note that the construction of this embodiment other than the above is similar to that of the above-mentioned eleventh embodiment.

In this dielectric isolation type semiconductor device 112, since the total sum $\Sigma W3$ of gaps $\Delta W3$ in the second buried N+ regions 26 is set to be greater than 0.01($\mu$m/v)×BV(v) (i.e., $\Sigma W3(\mu m) > 0.01(\mu m/v) \times BV(v))$, the porous oxide film region 2c can have a satisfactory dielectric breakdown strength with a sufficient margin for an electric field strength of 1 MV/cm.

Moreover, since the electric field potential crossing between the first and second high silicon concentration regions 12, 13 is evenly distributed by the first and second MFP structures of the first and second buried N+ regions 24, 26 and their capacity dividing functions, peaks of the electric field strength are leveled, and a high withstand-voltage or dielectric resistance characteristic can be achieved while keeping safer dielectric strength.

Although in the above-mentioned thirteenth embodiment, two rows or layers of the first and second MFP structures are provided, similar advantageous effects can be achieved even in cases where three or more rows or layers of MFP structures are adopted.

Embodiment 14

Figure 18:
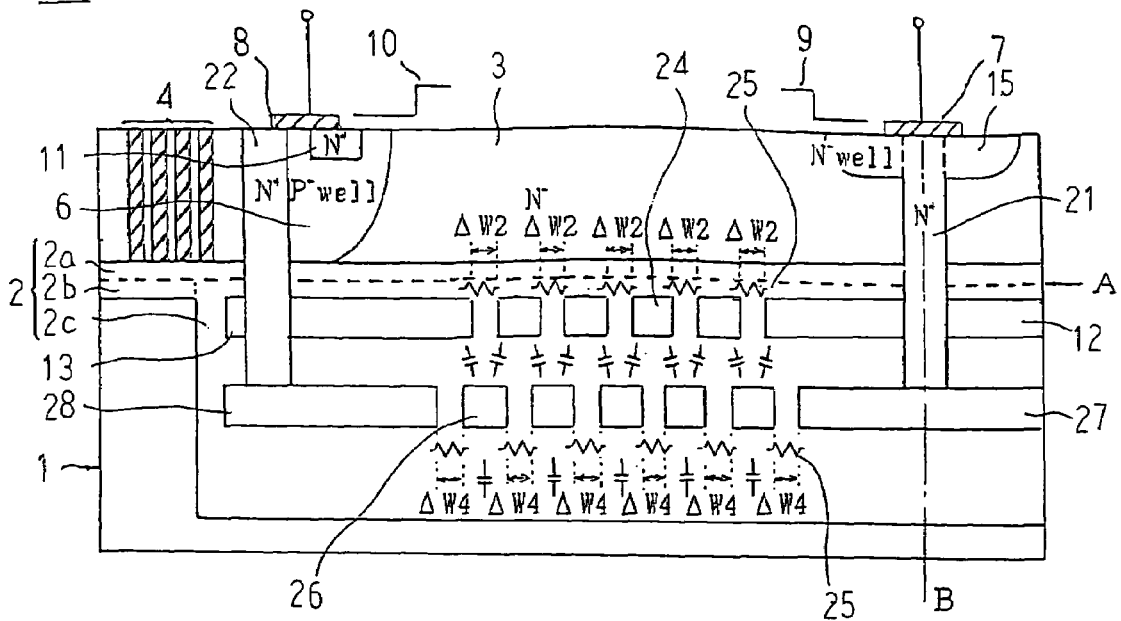
FIG. 18 is a cross sectional view schematically showing the construction of a dielectric isolation type semiconductor device according to a fourteenth embodiment of the present invention.

FIG. 18 is a cross sectional view that shows a dielectric isolation type semiconductor device according to a fourteenth embodiment of the present invention.

As shown in FIG. 18, in this dielectric isolation type semiconductor device, generally designated at a reference numeral 113, a third high silicon concentration region 27 is circularly or annularly arranged in the porous oxide film region 2c at a side of the first high silicon concentration region 12 opposite to the drift N− region, and a fourth high silicon concentration region 28 is also arranged in the porous oxide film region 2c at a side of the second high silicon concentration region 13 opposite to the drift N− region at the same depth as that of the third high silicon concentration region 27. In addition, the buried drain N+ region 21 is formed so as to be electrically connected with the first and third high silicon concentration regions 12, 27, and the buried source N+ region 22 is formed so as to be electrically connected with the second and fourth high silicon concentration regions 13, 28.

Moreover, the plurality of second buried N+ regions 26 are circularly or annularly arranged at a side of the first buried N+ regions 24 opposite to the drain electrode side in a manner mutually apart a distance $\Delta W4$ from one another so as to form a second MFP structure. Further, a plurality of electric conductivity imparting parts 25 are interposed between the first high silicon concentration region 12 and one of the first buried N+ regions 24, between the second high silicon concentration region 13 and another one of the first buried N+ regions 24, and between adjacent ones of the first buried N+ regions 24. Also, another plurality of electric conductivity imparting parts 25 are interposed between the third high silicon concentration region 27 and one of the second buried N+ regions 26, between the fourth high silicon concentration region 28 and another one of the second buried N+ regions 26, and between adjacent ones of the second buried N+ regions 26. These electric conductivity imparting parts 25 are formed, after formation of the porous oxide film region 2c, by driving Si, P, As or the like into the porous oxide film region 2c thus formed by means of high energy injection or implantation in the same range as the depth of the second buried N+ regions 26, and further in the same range as the depth of the first buried N+ regions 24.

With the above arrangement, resistance couplings due to the electric conductivity imparting parts 25 are interposed between the first high silicon concentration region 12 and the one of the first buried N+ regions 24, between the second high silicon concentration region 13 and the another one of the first buried N+ regions 24, and between the adjacent ones of the first buried N+ regions 24. Also, resistance couplings due to the electric conductivity imparting parts 25 are interposed between the third high silicon concentration region 27 and the one of the second buried N+ regions 26, between the fourth high silicon concentration region 28 and the another one of the second buried N+ regions 26, and between the adjacent ones of the first buried N+ regions 26. In addition, capacitive couplings are interposed between the layers of the first and second MFP structures, and between the second MFP structure and the semiconductor substrate 1, respectively.

Further, the total sum $\Sigma W4$ of the gaps $\Delta W4$ in the second buried N+ regions 26 is formed so as to satisfy the following inequity:

$$\Sigma W4(\mu m) > 0.01(\mu m/v) \times BV(v).$$

Here, note that the construction of this embodiment other than the above is similar to that of the above-mentioned eleventh embodiment.

In this dielectric isolation type semiconductor device 113, since the total sum $\Sigma W4$ of gaps $\Delta W4$ in the second buried N+ regions 26 is set to be greater than 0.01($\mu$m/v)×BV(v) (i.e., $\Sigma W4(\mu m) > 0.01(\mu m/v) \times BV(v))$, as in the case of the total sum $\Sigma W2$ of gaps $\Delta W2$ in the first buried N+ regions 24, the porous oxide film region 2c can have a satisfactory dielectric breakdown strength with a sufficient margin for an electric field strength of 1 MV/cm.

Moreover, since the electric field potential crossing between the first and second high silicon concentration regions 12, 13 is evenly distributed by the two layers of the first and second MFP structures of the first and second buried N+ regions 24, 26 and their capacity dividing functions, peaks of the electric field strength are leveled, and a high withstand-voltage or dielectric resistance characteristic can be achieved while keeping safer dielectric strength.

Embodiment 15

Figure 19:
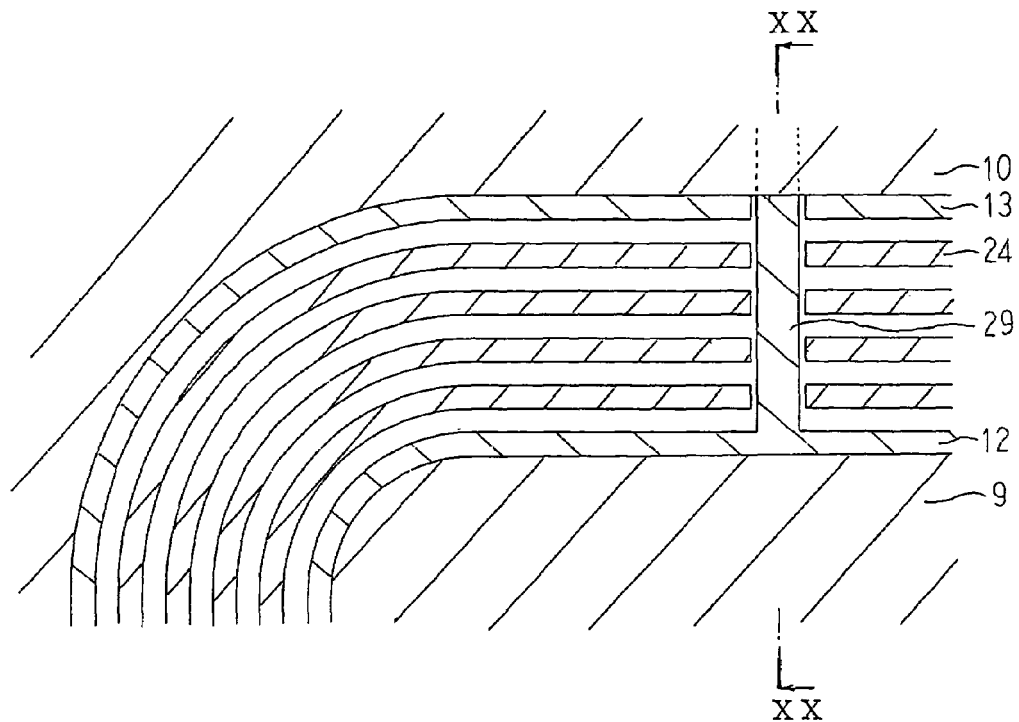
FIG. 19 is a view showing the positional relationship between first and second field plates and a buried $N^+$ region in a dielectric isolation type semiconductor device according to a fifteenth embodiment of the present invention, as seen from above in a direction orthogonal to an interface between bonding surfaces A.
Figure 20:
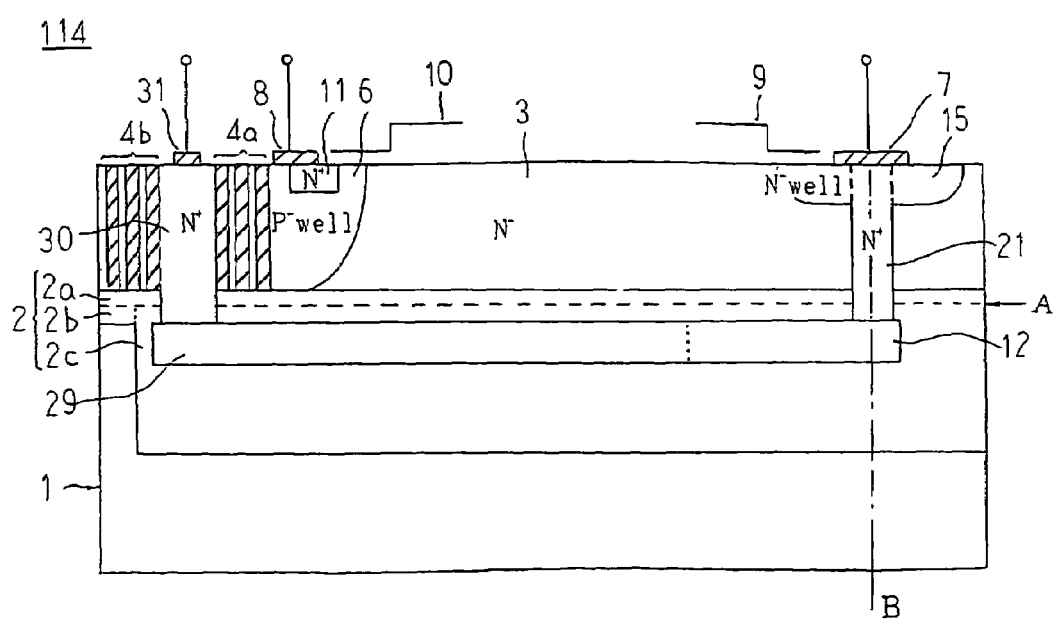
FIG. 20 is a cross sectional view taken along line XX-XX of FIG. 19 and seen from arrows therein.

FIG. 19 is a view that shows the positional relation between first and second field plates and a buried N+ region in a dielectric isolation type semiconductor device according to a fifteenth embodiment of the present invention, as seen from above in a direction orthogonal to an interface between bonding surfaces A. FIG. 20 is a cross sectional view taken along line XX-XX of FIG. 19 and seen from arrows therein.

As shown in FIG. 19 and FIG. 20, in this dielectric isolation type semiconductor device, generally designated at a reference numeral 114, the second high silicon concentration region 13 and the first buried N+ regions 24 are each formed in a partially cut or divided annular shape, and a drain lead (pull-out) wiring 29 comprising a buried N+ region is provided so as to extend from the first high silicon concentration region 12 to a source side through the divided portions of the first buried N+ regions 24 and the second high silicon concentration region 13. Additionally, a buried drain lead (pull-out) N+ region 30 is formed in the drift N− region 3 in a manner electrically separated or isolated from the source P− well region 6 by means of the first trench isolation 4a, and extends through the oxide film 2a and the porous oxide film region 2c so as to be electrically connected with the drain lead wiring 29. Also, a drain lead (pull-out) electrode 31 is formed on the upper surface of the drift N− region 3 so as to be in contact with the buried drain lead N+ region 30, and the second trench isolation 4b is circularly or annularly formed at an outer peripheral side of the buried drain lead N+ region 30 for separation of the entire device.

Here, note that the construction of this embodiment other than the above is similar to that of the above-mentioned eleventh embodiment.

According to this fifteenth embodiment, in addition to the above-mentioned advantageous effects of the eleventh embodiment, there are obtained the following advantageous effects. That is, the drain lead electrode 31 can be pulled out to the outer peripheral side of the source electrode 8 through the first high silicon concentration region 12, the drain lead wiring 29 and the buried drain lead N+ region 30.

In addition, the oxide film 2a and a portion of the porous oxide film region 2c on the drain lead wiring 29 serve as interlayer insulation films, and the porous oxide film region 2c, being formed of a porous silicon oxide film, is easy to thicken, so the dielectric strength of the drain lead wiring 29 can be improved following the increased dielectric resistance of the device.

Moreover, the dielectric strength required when the drain lead wiring 29 pulled out through the source side SOI layer (the drift N− region 3) depends on the first and second trench isolations 4a, 4b, so the dielectric resistance can be easily made higher by increasing the number of trenches of the first and second trench isolations 4a, 4b. Accordingly, such a drain lead (pull-out) electrode structure is able to ensure a sufficient lead (pull-out) dielectric stress as a semiconductor device.

Thus, by adopting this drain lead electrode structure, an oxidation thickening process or a CVD process for formation of a thick CVD oxide film by CVD conventionally required for interlayer insulation becomes unnecessary, thus making it possible to simplify the entire fabrication process as well as shortening the processing time.

Although in this fifteenth embodiment, the drain lead electrode structure is applied to the above-mentioned dielectric isolation type semiconductor device according to the eleventh embodiment, similar advantageous effects can be achieved even if applied to a dielectric isolation type semiconductor device according to any of the other embodiments.

Embodiment 16

Figure 21:
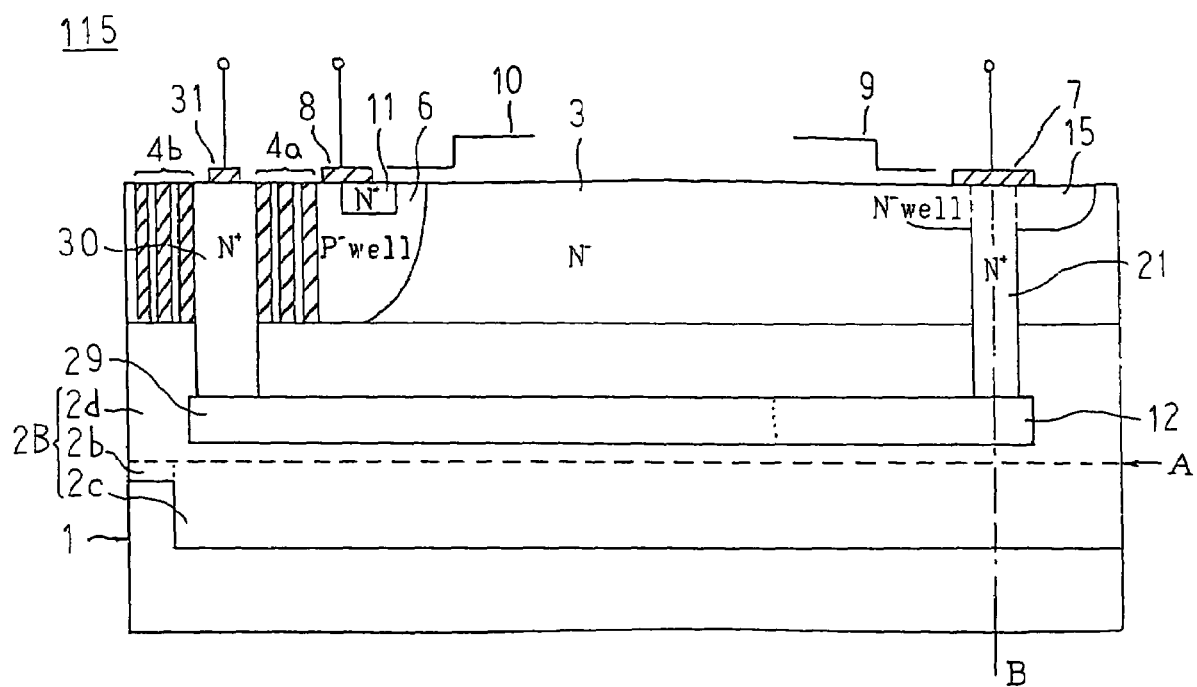
FIG. 21 is a cross sectional view schematically showing the construction of a dielectric isolation type semiconductor device according to a sixteen embodiment of the present invention.

FIG. 21 is a cross sectional view that shows a dielectric isolation type semiconductor device according to a sixteenth embodiment of the present invention.

As shown in FIG. 21, in this dielectric isolation type semiconductor device, generally designated at a reference numeral 115, a dielectric layer in the form of a buried oxide film 2B comprises a porous oxide film region 2d, an oxide film 2b and a porous oxide film region 2c, and bonding surfaces A comprise the porous oxide film region 2d, the oxide film 2b and the porous oxide film region 2c. In addition, the drift N− region 3 is formed on the porous oxide film region 2d, and the first and second high silicon concentration regions 12, 13, the first buried N+ regions 24 and the drain lead wiring 29 are formed in the porous oxide film region 2d.

Here, note that the construction of this embodiment other than the above is similar to that of the above-mentioned fifteenth embodiment.

In this sixteenth embodiment, the porous oxide film region 2d comprising a porous silicon film that can be easily thickened is made to function as an interlayer insulation layer. Thus, an oxidation thickening process or a CVD process for formation of a thick CVD oxide film by means of CVD conventionally required for interlayer insulation becomes unnecessary, and hence it is possible to simplify the entire fabrication process and shorten the processing time. Also, the interlayer insulation layer can be easily thickened, thus making it possible to achieve the high dielectric resistance characteristic.

In addition, there might be fear that when the buried drain N+ region 21 and the buried drain lead N+ region 30 cross the bonding surfaces A, the interface between the bonding surfaces A becomes a leakage current path. In this sixteenth embodiment, however, the buried drain N+ region 21 and the buried drain lead N+ region 30 are formed in a portion of a wafer lying at an SOI side from the interface between the bonding surfaces A, so that neither the buried drain N+ region 21 nor the buried drain lead N+ region 30 crosses the bonding surfaces A, and there occurs no leakage current path as referred to above, either.

Although in the above-mentioned respective embodiments, reference has been made to the case where an HV-MOS or an IGBT is used as a horizontal type high withstand-voltage device, the present invention can be similarly applied to any horizontal type high withstand-voltage device in general formed on an SOI, such as, for example, a diode, a transistor, and an EST (Emitter Switched Thyristor), while providing similar advantageous effects.

Moreover, although in the above-mentioned respective embodiments, an n-channel high withstand-voltage device has been described as a horizontal high withstand-voltage device, similar advantageous effects can be achieved even if the present invention is applied to a p-channel high withstand-voltage device.

While the invention has been described in terms of preferred embodiments, those skilled in the art will recognize that the invention can be practiced with modifications within the spirit and scope of the appended claims.

What is claimed is:

1. A dielectric isolation type semiconductor device comprising:
   a semiconductor substrate;
   a dielectric layer disposed adjacent to an entire area of a principal plane of said semiconductor substrate;
   a first semiconductor layer of a first conductivity type and of a low impurity concentration bonded to said semiconductor substrate through said dielectric layer;
   a trench isolation annularly formed in said first semiconductor layer to separate said first semiconductor layer in a lateral direction so as to provide an element range;
   a high withstand-voltage device having a second semiconductor layer of the first conductivity type and of a high impurity concentration selectively formed on a surface of a central portion of said element range within said first semiconductor layer, and a third semiconductor layer of a second conductivity type formed in said element range at a location apart from said second semiconductor layer so as to surround said second semiconductor layer;
   a first electrode disposed on and joined to a surface of said second semiconductor layer;
   a second electrode disposed on and joined to a surface of said third semiconductor layer;
   a first field plate disposed on said first semiconductor layer so as to cover said second semiconductor layer;
   a second field plate disposed on said first semiconductor layer so as to cover said third semiconductor layer and surround said first field plate; and
   a first high silicon concentration region formed in a porous oxide film region extending into said substrate and constituting a part of said dielectric layer at a location right under said first electrode;
   wherein said first electrode and said first high silicon concentration region are electrically connected to each other, and are configured to confine an electric potential within said porous oxide film between said substrate and said first high silicon concentration region.

2. The dielectric isolation type semiconductor device as set forth in claim 1, wherein
   said high withstand-voltage device comprises a horizontal type HV-MOS having a source region of the first conductivity type formed in said third semiconductor layer so as to be in contact with said second electrode; and
   said first high silicon concentration region is composed of a buried $N^+$ region, and a drain $N^+$ region is formed in said first semiconductor layer so as to be electrically connected to said first electrode and said first high silicon concentration region.

3. A dielectric isolation type semiconductor device comprising:
   a semiconductor substrate;
   a dielectric layer disposed adjacent to an entire area of a principal plane of said semiconductor substrate;
   a first semiconductor layer of a first conductivity type and of a low impurity concentration bonded to said semiconductor substrate through said dielectric layer;
   a trench isolation annularly formed in said first semiconductor layer to separate said first semiconductor layer in a lateral direction so as to provide an element range;
   a high withstand-voltage device having a second semiconductor layer of the first conductivity type and of a high impurity concentration selectively formed on a surface of a central portion of said element range, and a third semiconductor layer of a second conductivity type formed in said element range at a location apart from said second semiconductor layer so as to surround said second semiconductor layer;
   a first electrode disposed on and joined to a surface of said second semiconductor layer;
   a second electrode disposed on and joined to a surface of said third semiconductor layer;
   a first field plate disposed on said first semiconductor layer so as to cover said second semiconductor layer;
   a second field plate disposed on said first semiconductor layer so as to cover said third semiconductor layer and surround said first field plate; and
   a first high silicon concentration region formed in said dielectric layer at a location right under said first electrode, wherein:
   said first electrode and said first high silicon concentration region are electrically connected to each other;
   said high withstand-voltage device comprises a horizontal type HV-MOS having a source region of the first conductivity type formed in said third semiconductor layer so as to be in contact with said second electrode; and said first high silicon concentration region is composed of a buried $N^+$ region, and a drain $N^+$ region is formed in said first semiconductor layer so as to be electrically connected to said first electrode and said first high silicon concentration region; and
   said first high silicon concentration region is formed in a porous oxide film region that constitutes a part of said dielectric layer, and said drain $N^{30}$ region extends through said porous oxide film region so as to be electrically connected to said first high silicon concentration region.

4. A dielectric isolation type semiconductor device comprising:
   a semiconductor substrate;
   a dielectric layer disposed adjacent to an entire area of a principal plane of said semiconductor substrate;
   a first semiconductor layer of a first conductivity type and of a low impurity concentration bonded to said semiconductor substrate through said dielectric layer;
   a trench isolation annularly formed in said first semiconductor layer to separate said first semiconductor layer in a lateral direction so as to provide an element range;
   a high withstand-voltage device having a second semiconductor layer of the first conductivity type and of a high impurity concentration selectively formed on a surface of a central portion of said element range, and a third semiconductor layer of a second conductivity type formed in said element range at a location apart from said second semiconductor layer so as to surround said second semiconductor layer;
   a first electrode disposed on and joined to a surface of said second semiconductor layer;
   a second electrode disposed on and joined to a surface of said third semiconductor layer;
   a first field plate disposed on said first semiconductor layer so as to cover said second semiconductor layer;
   a second field plate disposed on said first semiconductor layer so as to cover said third semiconductor layer and surround said first field plate; and
   a first high silicon concentration region formed in said dielectric layer at a location right under said first electrode, wherein;
   said first electrode and said first high silicon concentration region are electrically connected to each other;
   said high withstand-voltage device comprises a horizontal type HV-IGBT of an anode short type including a drain region of the second conductivity type formed in said second semiconductor layer so as to be in contact with said first electrode and a source region of the first conductivity type formed in said third semiconductor layer so as to be contact with said second electrode; and said first high silicon concentration region is composed of a buried $N^+$ region and is formed in a porous oxide film region that constitutes a part of said dielectric layer, and an anode short $N^+$ region is formed in said first semiconductor layer so as to extend through said first electrode and said porous oxide film region to be electrically connected to said first high silicon concentration region.

5. A dielectric isolation type semiconductor device comprising:

a semiconductor substrate;

a dielectric layer disposed adjacent to an entire area of a principal plane of said semiconductor substrate;

a first semiconductor layer of a first conductivity type and of a low impurity concentration bonded to said semiconductor substrate through said dielectric layer;

a trench isolation annularly formed in said first semiconductor layer to separate said first semiconductor layer in a lateral direction so as to provide an element range;

a high withstand-voltage device having a second semiconductor layer of the first conductive conductivity type and of a high impurity concentration selectively formed on a surface of a central portion of said element range, and a third semiconductor layer of a second conductivity type formed in said element range at a location apart from said second semiconductor layer so as to surround said second semiconductor layer;

a first electrode disposed on and joined to a surface of said second semiconductor layer;

a second electrode disposed on and joined to a surface of said third semiconductor layer;

a first field plate disposed on said first semiconductor layer so as to cover said second semiconductor layer;

a second field plate disposed on said first semiconductor layer so as to cover said third semiconductor layer and surround said first field plate; and a first high silicon concentration region formed in said dielectric layer at a location right under said first electrode, wherein:

said first electrode and said first high silicon concentration region are electrically connected to each other;

said high withstand-voltage device comprises a horizontal HV-IGBT of a non-punch-through type including a drain region of the second conductivity type formed in said second semiconductor layer so as to be in contact with said first electrode and a source region of a first conductivity type formed in said third semiconductor layer so as to be in contact with said second electrode; and said first high silicon concentration region is composed of a buried $N^+$ region and is formed in a porous oxide film region that constitutes a part of said dielectric layer, and said drain region of the second conductivity type is formed in said first semiconductor layer so as extend through said porous oxide film region to be electrically connected to said first high silicon concentration region.

6. The dielectric isolation type semiconductor device as set forth in claim 3, further comprising:

a second high silicon concentration region composed of a buried $N^+$ region that is formed in said porous oxide film region at a location right under said second electrode so as to surround said first high silicon concentration region;

wherein said second electrode is electrically connected to said second high silicon concentration region through said third semiconductor layer or a second electrode side connection $N^+$ region.

7. The dielectric isolation type semiconductor device as set forth in claim 3, further comprising:

a second high silicon concentration region composed of a buried $N^+$ region that is formed in said porous oxide film region at a location right under said second electrode so as to surround said first high silicon concentration region;

wherein an electrode connection $N^+$ region is formed in said first semiconductor layer so as to be electrically connected to said second high silicon concentration region in a state electrically insulated from said third semiconductor layer; and a third electrode is joined to and disposed on a surface of said electrode connection $N^+$ region.

8. The dielectric isolation type semiconductor device as set forth in claim 3, wherein when the dielectric strength of a high dielectric resistance island required to drive said semiconductor device is BV, said porous oxide film region having a diametral width W from one end of said first high silicon concentration region and a depth T from said first high silicon concentration region to its side opposite to said first semiconductor layer is constructed so as to satisfy the following relationships:

$$W>0.01\times BV(\mu m), \text{ and}$$

$$T>0.01\times BV(\mu m).$$

9. The dielectric isolation type semiconductor device as set forth in claim 6, wherein when the dielectric strength of a high dielectric resistance island required to drive said semiconductor device is BV, said porous oxide film region having a diametral width W of its area between said first and second high silicon concentration regions and a depth T from said first and second high silicon concentration regions to its side opposite to said first semiconductor layer is constructed so as to satisfy the following relationships:

$$W>0.01\times BV(\mu m), \text{ and}$$

$$T>0.01\times BV(\mu m).$$

10. The dielectric isolation type semiconductor device as set forth in claim 8, wherein an area of said porous oxide film region corresponding to said diametral width W is contained in an area WS between said first and second field plates with respect to a direction orthogonal to bonding surfaces of said dielectric layer and said first semiconductor layer.

11. The dielectric isolation type semiconductor device as set forth in claim 8, wherein a plurality of annular field plate $N^+$ regions are disposed diametrically parallel to one another in an area of said porous oxide film region corresponding to said diametral width W and independently from one another in a capacitively coupled manner so as to surround said first high silicon concentration region and construct a multi-field plate structure.

12. The dielectric isolation type semiconductor device as set forth in claim 11, wherein said plurality of annular field plate $N^+$ regions are further disposed in said porous oxide film region in one or more layers at a location or locations different in depth from said multi-field plate structure in a manner such that adjacent ones of said field plate $N^+$ regions within or between said one or more layers are capacitively coupled with one another.

13. The dielectric isolation type semiconductor device as set forth in claim 8, wherein a plurality of annular field plate N$^+$ regions are disposed diametrically parallel to one another in an area of said porous oxide film region corresponding to said diametral width W and independently from one another so as to surround said first high silicon concentration region, and are coupled with one another through resistance components to construct a multi-field plate structure.

14. The dielectric isolation type semiconductor device as set forth in claim 13, wherein at least one first-electrode side high silicon concentration region composed of a buried N$^+$ region is disposed in said porous oxide film region at a side of said first high silicon concentration region opposite to said first semiconductor layer in one or more layers at a location or locations different in depth from said first high silicon concentration region in a manner electrically connected to said first electrode;

at least one second-electrode side high silicon concentration region composed of a buried N$^+$ region is disposed in said porous oxide film region at a side of said second high silicon concentration region opposite to said first semiconductor layer at a location or locations of the same depth as that of said at least one first-electrode side high silicon concentration region in a manner electrically connected to said second electrode;

said plurality of annular field plate N$^+$ regions are further disposed diametrically parallel to one another in respective areas between said first-electrode side and second-electrode side high silicon concentration regions at locations of the same depth thereof and independently from one another so as to surround said first-electrode side high silicon concentration region; and adjacent ones of said field plate N$^+$ regions within each of said one or more layers are resistively coupled with one another, and adjacent ones of said field plate N$^+$ regions between said one or more layers are capacitively coupled with one another.

15. A dielectric isolation type semiconductor device comprising:

a semiconductor substrate;

a dielectric layer disposed adjacent to an entire area of a principal plane of said semiconductor substrate;

a first semiconductor layer of a first conductivity type and of a low impurity concentration bonded to said semiconductor substrate through said dielectric layer;

a trench isolation annularly formed in said first semiconductor layer to separate said first semiconductor layer in a lateral direction so as to provide an element range;

a high withstand-voltage device having a second semiconductor layer of the first conductivity type and of a high impurity concentration selectively formed on a surface of a central portion of said element range, and a third semiconductor layer of a second conductivity type formed in said element range at a location apart from said second semiconductor layer so as to surround said second semiconductor layer;

a first electrode disposed on and joined to a surface of said second semiconductor layer;

a second electrode disposed on and joined to a surface of said third semiconductor layer;

a first field plate disposed on said first semiconductor layer so as to cover said second semiconductor layer;

a second field plate disposed on said first semiconductor layer so as to cover said third semiconductor layer and surround said first field plate; and a first high silicon concentration region formed in said dielectric layer at a location right under said first electrode, wherein:

said first electrode and said first high silicon concentration region are electrically connected to each other;

lead wiring composed of a buried N$^+$ region is provided so as to extend through a porous oxide film region constituting a part of said dielectric layer in a diametral direction from said first high silicon concentration region to a lower portion under said trench isolation; and a first-electrode lead electrode is pulled out of said lead wiring in a state electrically insulated from said second electrode by a wall of said trench isolation.

16. The dielectric isolation type semiconductor device as set forth in claim 15, wherein said porous oxide film region comprises a first-semiconductor-layer side porous oxide film region and a semiconductor-substrate side porous oxide film region bonded to each other with bonding surfaces of said dielectric layer interposed therebetween; and said lead wiring is formed in said first-semiconductor-layer side porous oxide film region.

\* \* \* \* \*